(12) United States Patent
Amonett et al.

(10) Patent No.: US 8,051,667 B2
(45) Date of Patent: Nov. 8, 2011

(54) ICEMAKER CONTROL MODULE

(75) Inventors: Daniel K. Amonett, Murfreesboro, TN (US); Kevin Mumpower, Cookeville, TN (US)

(73) Assignee: France/Scott Fetzer Company, Fairview, TN (US)

( * ) Notice: Subject to any disclaimer, the term of this patent is extended or adjusted under 35 U.S.C. 154(b) by 451 days.

(21) Appl. No.: 12/353,041

(22) Filed: Jan. 13, 2009

(65) Prior Publication Data

US 2009/0178420 A1 Jul. 16, 2009

Related U.S. Application Data

(60) Provisional application No. 61/043,578, filed on Apr. 9, 2008, provisional application No. 61/020,906, filed on Jan. 14, 2008.

(51) Int. Cl.
*F25C 5/08* (2006.01)
*F25C 1/00* (2006.01)

(52) U.S. Cl. ............................. 62/135; 62/73; 62/351

(58) Field of Classification Search ................ 62/66, 71, 62/73, 135, 340, 349, 351
See application file for complete search history.

(56) References Cited

U.S. PATENT DOCUMENTS

| | | | |
|---|---|---|---|
| 3,217,510 A | 11/1965 | Kniffin et al. | |
| 3,308,631 A | 3/1967 | Kniffin | |
| 4,142,378 A | 3/1979 | Bright et al. | |
| 4,649,717 A | 3/1987 | Tate, Jr. et al. | |
| 4,697,432 A | 10/1987 | Cole | |
| 5,160,094 A * | 11/1992 | Willis et al. | 62/137 |
| 5,212,955 A | 5/1993 | Hogan | |
| 5,261,248 A | 11/1993 | Willis et al. | |
| 5,297,394 A * | 3/1994 | Frohbieter et al. | 62/135 |
| 5,718,121 A | 2/1998 | Edwards et al. | |
| 5,823,001 A | 10/1998 | Patrick et al. | |
| 6,112,540 A | 9/2000 | Serrels et al. | |
| 6,276,160 B1 | 8/2001 | Terada et al. | |
| 6,334,318 B1 | 1/2002 | Ando et al. | |
| 6,574,974 B1 | 6/2003 | Herzog et al. | |
| 6,588,227 B2 | 7/2003 | Kim et al. | |
| 6,637,217 B2 | 10/2003 | Kim et al. | |
| 6,640,565 B2 * | 11/2003 | Tchougounov et al. | 62/135 |
| 7,146,820 B2 | 12/2006 | Comerci et al. | |
| 7,201,007 B2 | 4/2007 | Shoukyuu et al. | |
| 7,216,491 B2 | 5/2007 | Cole et al. | |
| 2007/0068189 A1 | 3/2007 | Villani | |

* cited by examiner

*Primary Examiner* — Marc Norman
(74) *Attorney, Agent, or Firm* — Wood, Herron & Evans, LLP

(57) ABSTRACT

An icemaker control module for controlling an icemaker making ice bodies in a freezer has a base with snap fit components including an insert molded circuit board, a motor assembly, an ice level sensing system using a bail arm or a paddle, and a water fill system. Lance features in the circuit board connect switch and motor leads. The thermostat, ground wire, and heater of the icemaker electrically couple to the insert molded circuit board when the ice maker control module is joined to the ice maker. Energy may be conserved by pausing rotation and turning off the heater. There is a method for manufacturing the insert molded circuit board in a cell.

2 Claims, 41 Drawing Sheets

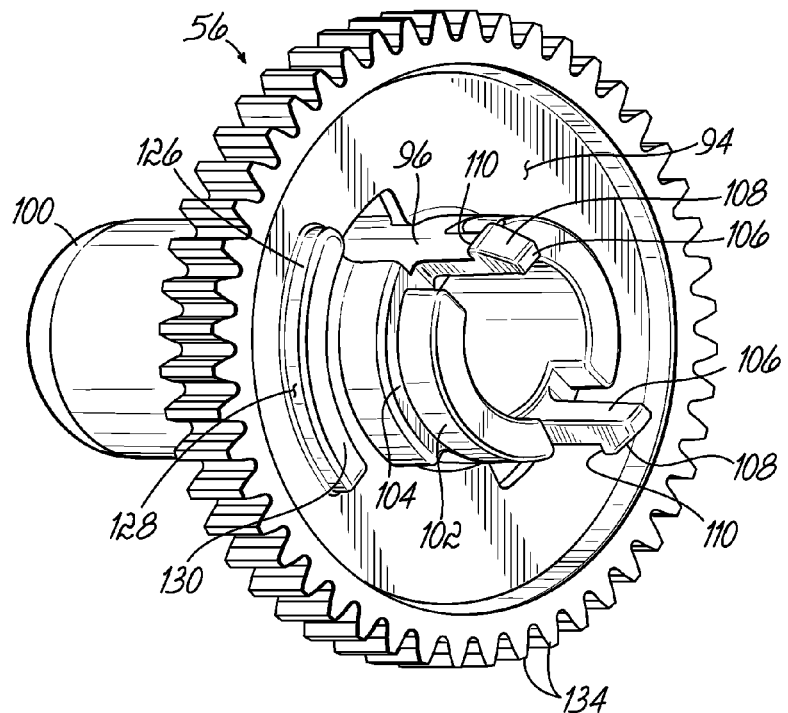
FIG. 4
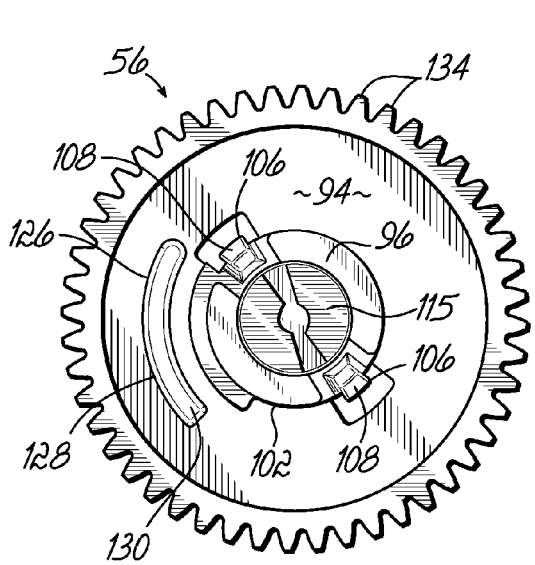 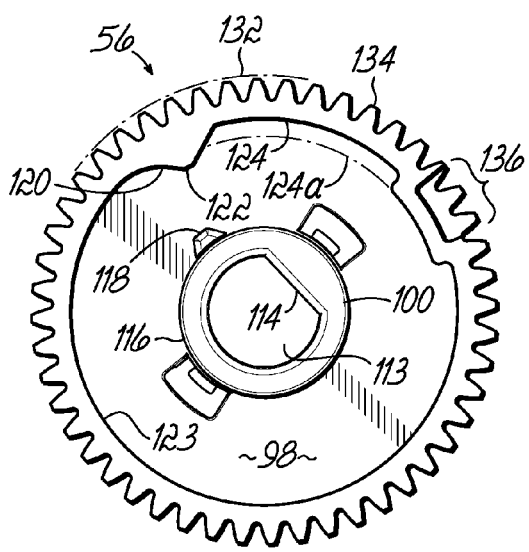
FIG. 4A  FIG. 4B

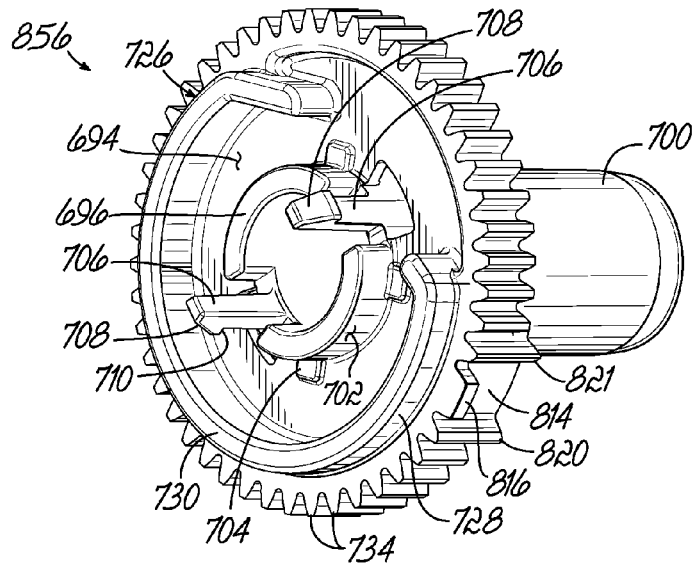
FIG. 19
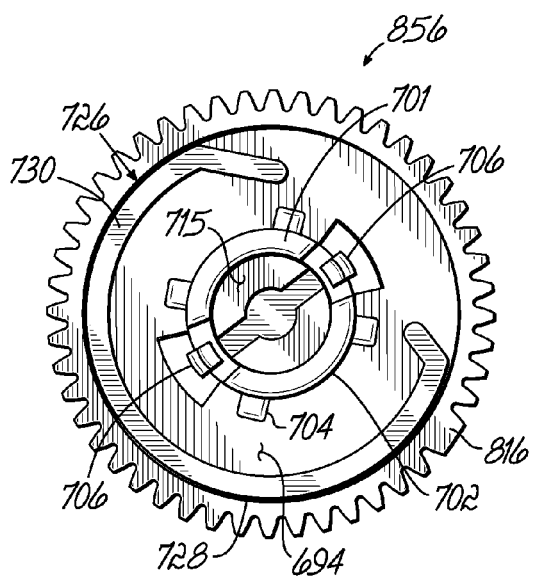 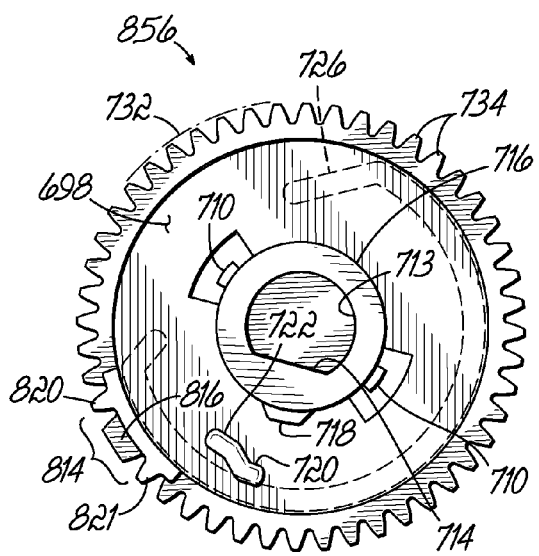
FIG. 20A   FIG. 20B

ICEMAKER CONTROL MODULE

RELATED APPLICATION

This application claims benefit of U.S. Provisional Patent Application Ser. No. 61/020,906 filed Jan. 14, 2008 and U.S. Provisional Patent Application Ser. No. 61/043,578 filed Apr. 9, 2008 both of which are hereby incorporated herein in their entirety.

FIELD OF THE INVENTION

The present invention generally relates to an icemaker used in the freezer space of a domestic refrigerator freezer, and specifically to a control module for such an icemaker, and an improved method of manufacture.

BACKGROUND

Icemakers in the freezer section of residential refrigerator freezers are well known and produced and installed in large volume. Typically such icemakers work by:
 filling molds with the proper amount of water to make ice bodies of the desired size, without overfilling and spilling excess water,
 determining when the water has become solid ice,
 performing an action to harvest the ice bodies from the mold and move them to a storage container,
 repeating the cycle.
To successfully perform the above steps, it is also common that the icemaker:
 1. briefly heat the molds to loosen the ice bodies and
 2. sense when the storage container is full, to delay moving ice bodies to the storage container until there is room again.

There are three basic icemaker designs currently on the market. The first design consists of a steel or plastic base, to which a motor, two switches, a gear, a cam and an adjusting lever are attached. A third switch and another lever are attached to the icemaker housing along with the thermostat, heater, wire harness and bail arm (like bail arm 24 that will be in the detailed description of this application). The motor, switches, thermostat, heater and wire harness are all connected with lead wires, making final assembly very labor intensive and prone to wiring errors. Also, the water fill level is controlled by time, which is adjusted by moving one of the switches attached to a lever, which varies the distance between the switch actuator and the cam ramp surface. U.S. Pat. No. 5,823,001 is an example of a patent that refines this first design of an icemaker.

The second design consists of a self-contained control module and the icemaker housing. The control module is made up of a plastic base, to which a number of copper stampings are assembled, then a cam, gear, two levers, adjusting screw and motor are attached. The gear also has a number of copper stampings assembled to it. The switching is accomplished by formed features of the copper stampings in the base contacting the copper stampings in the gear, completing the circuit. Formed features of the copper stampings in the base make the connections to the heater, thermostat and wiring harness when the control module is attached to the icemaker housing. U.S. Pat. Nos. 4,649,717 and 7,146,820 are examples of patents that refine this second design of an icemaker.

The third design consists of an electronic control circuit that replaces the snap switches in the previous two designs with magnetic proximity switches and a liquid level sensor, then the motor, gear and bail arm levers are assembled into the icemaker housing and all electrical connections are made with lead wires. U.S. Pat. No. 6,637,217 is an example of a patent that refines this third design of an icemaker.

Engineers and business people who mass-produce products tend to modularize them into smaller portions. An example of this is the automotive industry, where many subassemblies of a car, for example the engine, chassis, and transmission are designed and built separately. Later these modules are efficiently assembled.

With regards to icemakers, modularization by some manufacturers has changed the terminology used. Formerly, the term "icemaker" referred to the entire device, including a control. U.S. Pat. No. 5,261,248 to Willis et al. is an example of this terminology. In that patent, item 26 is the icemaker and 38 is a control that is a part of the icemaker 26. Currently, with modularization, a device for making ice has a portion referred to as an icemaker control module (ICM) that can be pre-assembled, and attached to an "icemaker" portion. An example of modularized terminology is in U.S. Pat. No. 7,146,820. Many improvements to either the icemaker control module portion, or the icemaker portion, may be done independently of the other.

The design of the icemaker portion has remained fairly constant. It is made of only a few parts so assembly labor is less of an issue. Most of the parts remain stationary and are not subject to wear. The icemaker portion is not responsible for the details of controlling the cycle, so there is less need to improve the design to seek precision and adjustability.

On the other hand, the ICM has many moving parts that must be assembled, leading to high labor costs. The first and third designs mentioned above each have about 40 components, and the second design has about 21 components.

The ICM must operate precisely and reliably. Service technicians may prefer that the icemaker be adjustable should the need arise. Naturally, manufacturers desire to make the pieces, and the assembled ICM, at a reduced cost. Among ways to do this are to reduce the number of parts and improve the manner in which they assemble. Designs and components that can be assembled by automated equipment, with few connections, and little human involvement, are desirable. They further desire that the ICM be able to be assembled to the icemaker portion in equally easy fashion.

SUMMARY OF THE INVENTION

In a first aspect, an icemaker control module for controlling an icemaker inside a freezer area has a circuit board having a conducting circuit adapted to contact and electrically couple to electrical components of the icemaker when the icemaker control module and the icemaker are joined together and at least one moving mechanical portion adapted to mechanically couple to at least one mechanical portion of the icemaker when the icemaker control module and the icemaker are joined together.

In another aspect, an icemaker control module for controlling an icemaker that makes ice-bodies inside a freezer has a base having a first hole and a second hole and an adjuster. It also has a drive gear with a water-fill cam that rotates in the first hole. A water-fill adjust lever is pivotally connected to the second hole, and adjustably coupled to the adjuster. A water-fill lever has a first end pivotally coupled to the water-fill adjust lever and a cam contact that is contacted by the water-fill cam. A second end of the water-fill lever contacts a water-fill switch. When one adjusts the coupling of the water-fill adjust lever to the adjuster, it changes the closure time of the water-fill switch to change the size of the ice-bodies made by the icemaker.

Yet another aspect is a method of manufacturing an insert molded circuit board for an icemaker. The method includes piercing and bending conducting sheet material to form lance connections configured to mechanically retain and electrically couple electrical components. Cutting the conducting sheet material into a pattern having a plurality of closely spaced shapes temporarily connected by fingers of the sheet material to stabilize the pattern. Molding a non-conductive material around the pattern to give the sheet material support and maintain the close spacing. And, severing the fingers of sheet material so that the closely spaced shapes are not electrically connected.

In another aspect, a method of manufacturing an icemaker control module includes snap fitting to a base a drive gear, a motor assembly having a pinion, a fill mechanism, an insert molded circuit board having three switches, and an ice body level sensing system.

A further method reduces the energy consumption of an icemaker by beginning harvest when a thermostat closes a circuit to send electric current through a heater and to a motor rotating a gear so that the heater heats an ice mold to loosen ice bodies. Stopping, by actions of the gear after the ice releases from the mold, current flowing through the heater. Continuing to rotate the gear to open and close a water valve to fill the mold with water. Pausing rotation of the gear in a position that continues to prevent current flowing through the heater. Resuming rotation of the gear to complete the harvest cycle at an elapsed time calculated to allow the thermostat to reset predominately from the warmth of the water that filled the ice mold.

Additional features and advantages of the present invention are described in, and will be apparent from, the detailed description of the presently preferred embodiments and from the drawings. Like numbers are used to indicate like components in the various embodiments.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to explain the principles of the invention.

FIG. 4 is a perspective view of the drive gear of FIG. 3A.

FIG. 4A is a front view of the drive gear of FIG. 4.

FIG. 4B is a rear view of the drive gear of FIG. 4.

FIG. 19 is a perspective view of the drive gear of the embodiment in FIG. 15.

FIG. 20A is a front view of the drive gear of FIG. 19.

FIG. 20B is rear view of the drive gear of FIG. 19.

DETAILED DESCRIPTION

Figure 1:
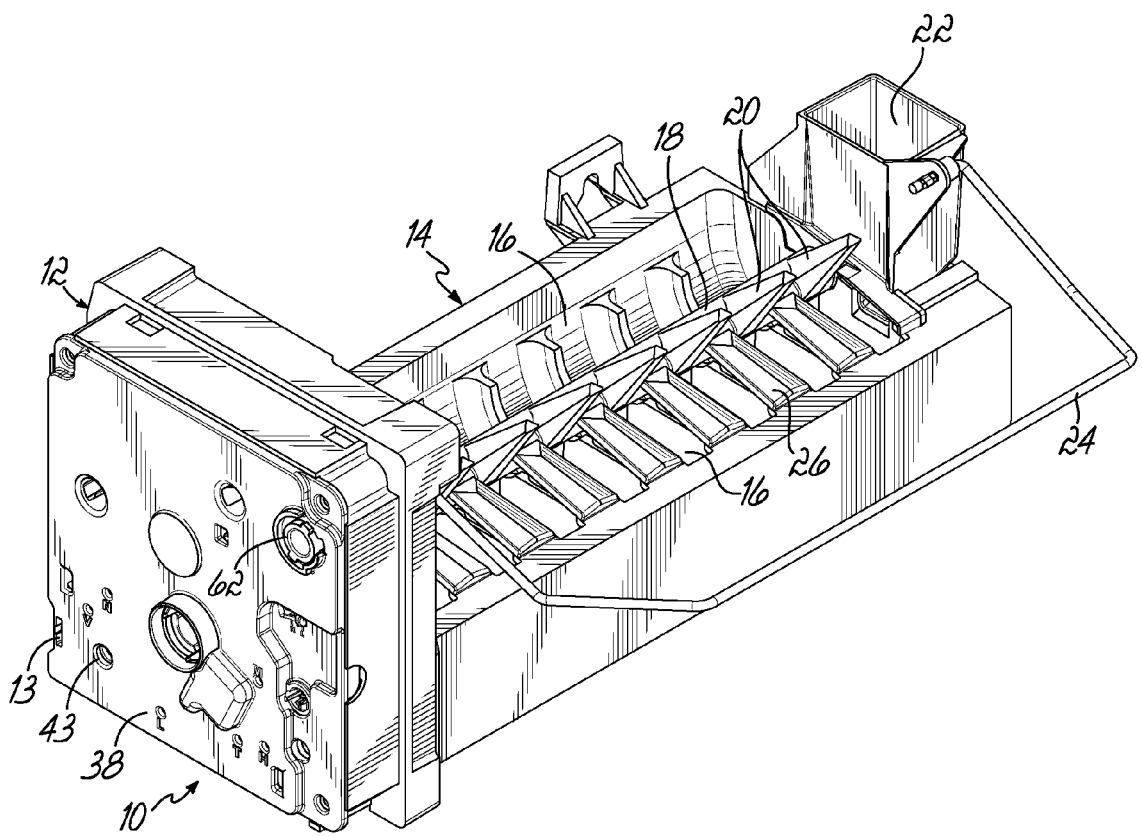
FIG. 1 is a perspective view of a first embodiment of an icemaker control module affixed to an icemaker.

In the detailed description that follows, it will be evident that the icemaker control module of the current invention is optimized for efficient assembly. The innovations included in the specifically described embodiments of an icemaker control module are applicable to other icemakers and their control modules, with appropriate adaptations to match the icemaker interfaces. The icemaker control module includes the following features for ease of assembly:

The icemaker control module, when pushed onto the icemaker, mechanically couples to the ejector shaft. And, it electrically couples to the thermostat, ground wire, and heater element on the icemaker. These couplings are accomplished without the use of wires or connectors.

The electrical circuits of the icemaker control module are assembled upon an insert molded circuit board. The electrical traces within the insert-molded circuit board are manufactured starting with a single copper sheet. Lance features formed in the electrical traces electrically couple to electrical components to complete the circuits. The lance features also mechanically retain the electrical component connections.

Three subminiature switches and a motor are configured to push onto the insert-molded circuit board without the use of connectors or soldering.

The insert-molded circuit board is configured to push onto a base.

A one-piece gear with integrated cam-like control surfaces is configured to push onto the base. The gear does not have any metal or electrically conductive parts.

A water fill system to control the fill-time of the ice mold has a fill lever configured to push onto the base. In an adjustable embodiment of the system a water fill adjust lever is configured to push onto the base, and adjustably position the fill lever. The adjustable embodiment of the system will be described first, followed by the not adjustable embodiment of the system.

In a first embodiment, a bail pivot, a bail rod, and a spring combine to be driven by a control surface on the one-piece gear to sense when ice making should be temporarily halted. The same parts sense when ice-making should be restarted. The bail pivot and bail rod are configured to push onto the base. The bail arm, being a portion of the icemaker rather than the control module, is unchanged.

In a second embodiment, a paddle is used instead of a bail arm. A mechanical off switch provides an easily identified method to turn off the icemaker rather than lifting the bail arm of the first embodiment, or the paddle of the second embodiment.

For either embodiment, a delay drive with energy savings benefits may be incorporated.

Each of the features above will be further described with reference to specific figures. Because the icemaker and icemaker control module usually mount in a uniform orientation on the left (as viewed by a person looking into the freezer) wall of a freezer, that orientation will be used to define, for descriptive purposes, the "front". Front will mean the front of the refrigerator freezer. Or said in another way, the direction from which a person looks into the freezer. Aft, rear, or a similar term will be used to refer to the opposite direction. Left and right will also refer to as viewed by a person looking into the freezer, unless specifically being used to refer to the left or right of a figure.

With respect to FIGS. 1, 2, 3, and 3A, an icemaker control module 10 is mounted within a control housing 12 of an icemaker 14. An electrical connector 13 receives electrical power and ground, and provides an electrical pathway to a water supply valve 15 (FIG. 13A) that is anywhere in a water supply line (not shown) for the icemaker. The icemaker has an ice body mold 16, an ejector shaft 18 with a plurality of ejectors 20, a fill cup 22, a bail arm 24, strippers 26 and other components that are normally part of the icemaker. Protruding (FIG. 2) from the control housing 12 are six interface points for an icemaker control module. They are a ground wire 28, two heater-contacts 30 from a heater 31, two thermostat contacts 32 from a thermostat 33, and an ejector shaft end 34 having a flat 36.

The icemaker control module 10 forward end has a base 38. Snapped to the base 38, is an insert molded circuit board 40 having a bus pin 41, the connector 13, an access hole 43, a barrier 45 best seen in FIG. 5B, a recess 47, a fill switch 44 and a home switch 46 both on the aft side, and an ice body storage level switch 48 on the forward side. Items 40, 41, 13, 44, 46, and 48 taken together are an insert molded circuit assembly 49. Also snapped to the base is a motor assembly 50 having two electric wire leads 51 and a gear cup 52 that contains a gear train. A pinion gear 54 extends from the gear cup 52 a minimal distance. By keeping the extension distance to a minimum the rigidity and concentricity of the pinion gear is increased. This increases the efficiency and precision of meshing with a drive gear 56, and helps to minimize dynamic forces that may cause wear and tear. The one-piece drive gear 56 is snapped into the base in meshing relationship with the pinion gear. The drive gear is rotated by the pinion gear. The drive gear positions and sequences an ice body storage-sensing system 58 and a water-fill system 60.

The storage-sensing system 58 has a bail pivot 62 snapped to the base 38. The bail pivot 62 has a protrusion 63 that couples the bail pivot 62 to a bail rod 64 at a hole 65 in the bail rod. Protrusion 63 also cooperates with a detent on the base to hold the bail arm 24 in a raised position when a user chooses to turn off the icemaker. A spring 66 is on an appendage 67 of the bail pivot. The bail rod has a pin 68, a contact 69, and a cam follower 70.

Figure 2:
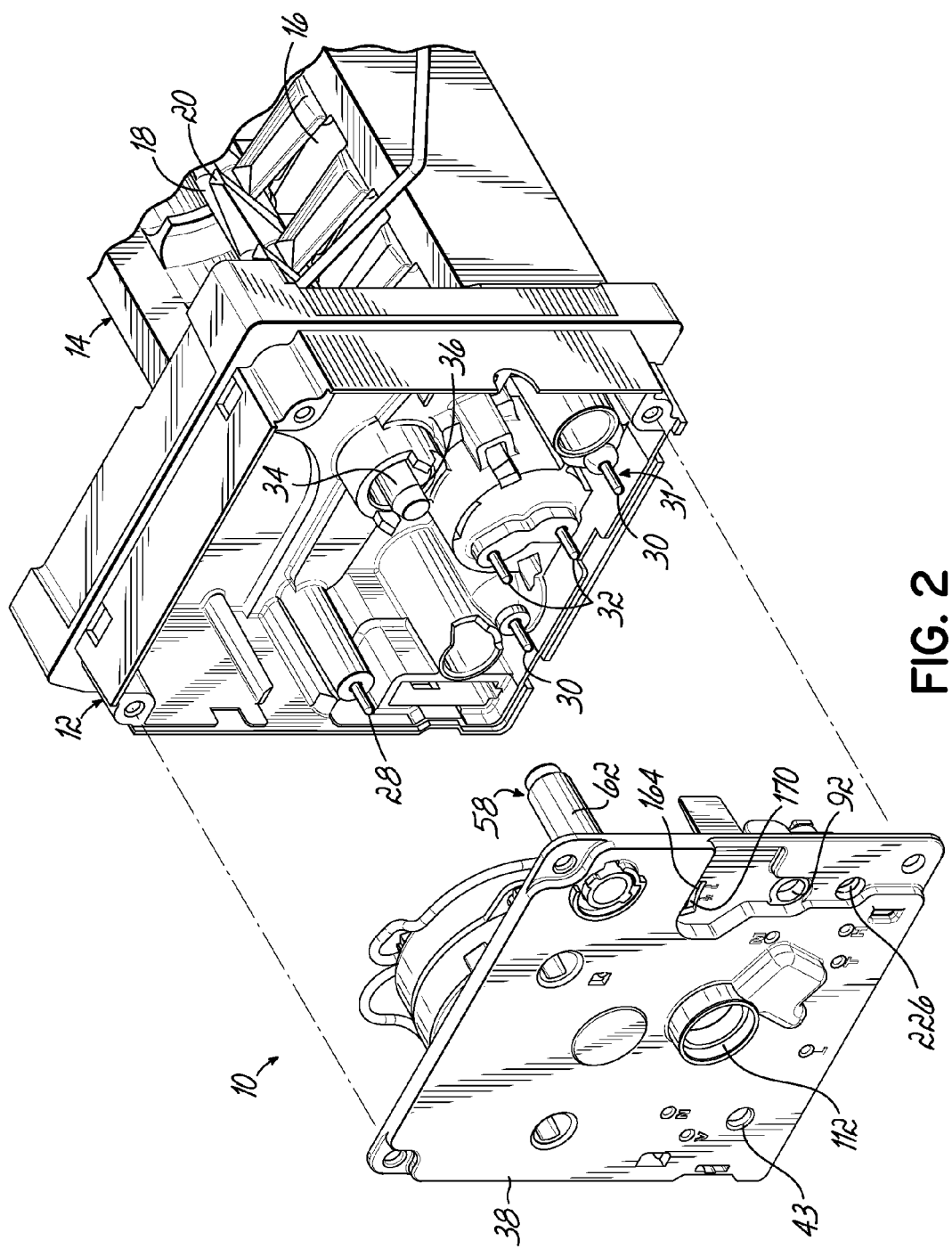
FIG. 2 is a perspective view of the icemaker control module of FIG. 1 separated from the icemaker.
Figure 3:
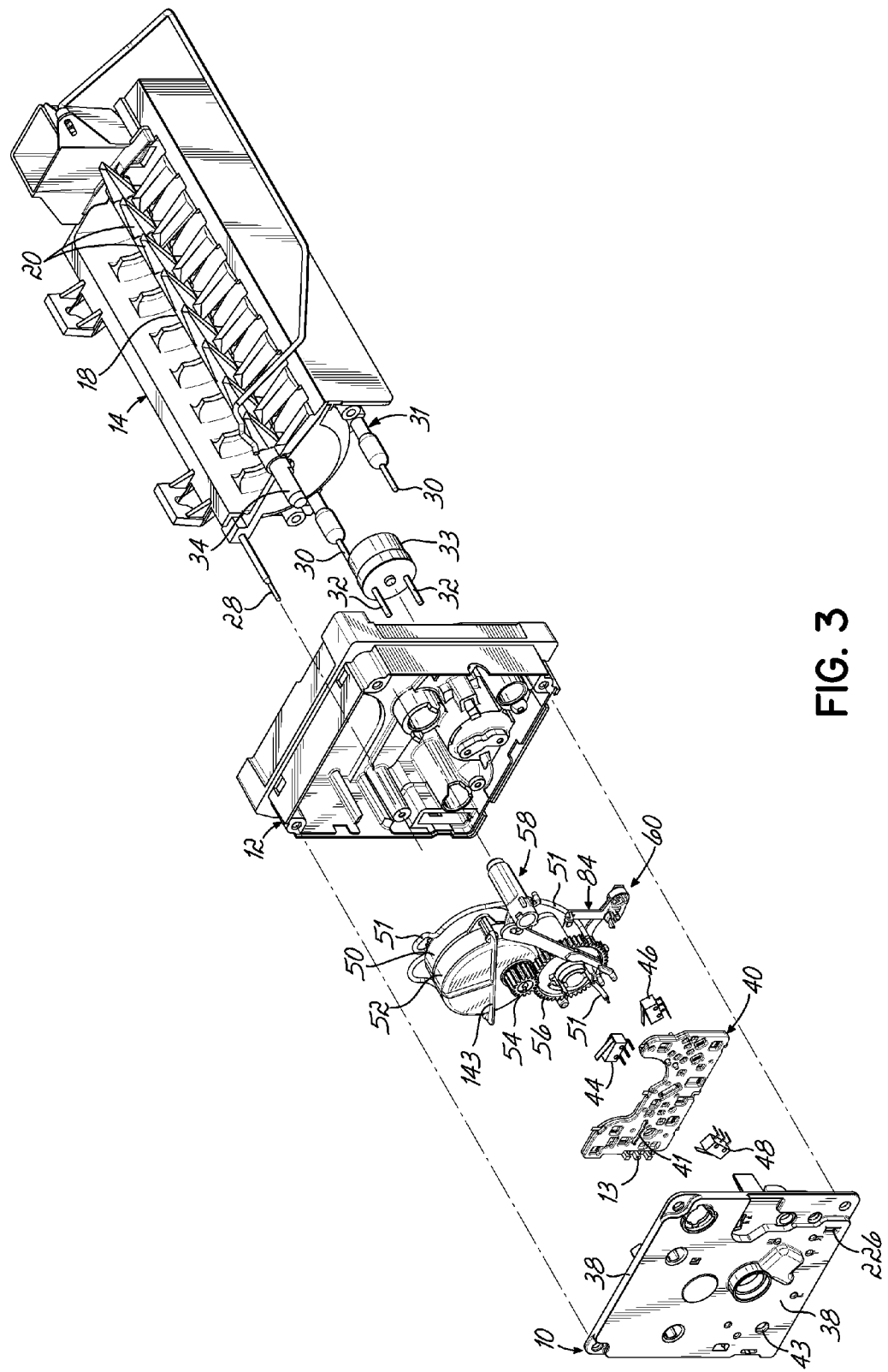
FIG. 3 is a partially exploded perspective view of the icemaker and the control module of FIG. 1.
Figure 3A:
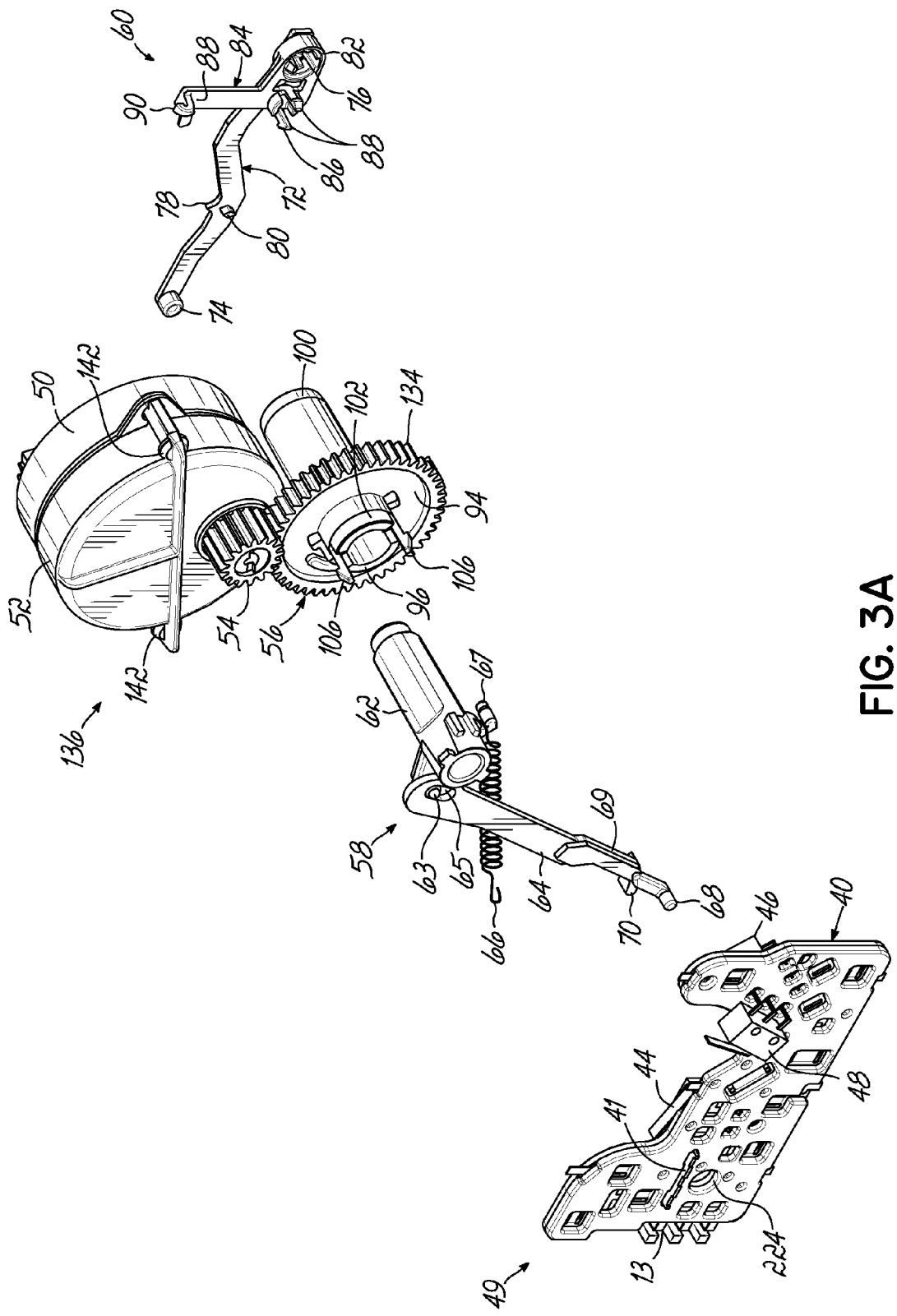
FIG. 3A is an enlarged perspective view of portions of FIG. 3.

The water-fill system 60 has a fill lever 72 with a contact 74 at one end and a male coupling 76 at the other. In the approximate middle of the fill lever is a first cam follower 78 facing upward towards the center axis of the drive gear, and a second cam follower 80 facing forward. A spacer 81 (FIG. 5B) spaces and stabilizes the fill lever 72 to the control housing 12. The male coupling 76 of the fill lever 72 snaps into an aperture 82 in a fill adjust lever 84. The fill adjust lever 84 has a second male coupling 86, at least one tooth 88, and a retainer 90. The second male coupling 86 snaps into the base at an aperture 92 (as best shown in FIGS. 2 and 6).

With reference to FIG. 4-4B, the drive gear 56 has a front face 94 with a front hub 96, and a rear face 98 with a rear hub 100. The front hub 96 has a radial bearing surface 102 and an axial bearing surface 104. Two resilient fingers 106 have a lead chamfer 108 and a seating surface 110. The fingers snap into the base 38, at an aperture 112 (FIG. 2) and retain the drive gear while it rotates within the base. The rear hub 100 has a bore 113 and a flat 114 sized to assemble to the ejector shaft end 34 and the flat 36, respectively. Inside the bore 113 is a partition 115 (FIG. 4A).

The drive gear 56, along with the circuitry to be described later, sequences and drives three functions. The three functions are the water-fill function, the storage-sensing function, and the start-stop function. Features of the drive gear 56 involved in each function will now be described. The functions themselves will be described later.

The water-fill function uses a water-fill-on profile 116 on an outside surface of the aft hub 100. The water-fill-on profile 116 has a protrusion 118 in the direction away from the center axis of the drive gear 56. A water-fill-off profile 120 having a protrusion 122 in the direction toward the center axis of the drive gear 56 is on an outer rim 123. Adjacent the protrusion 122 is a water-fill parking area 124. An alternative embodiment 124a of the water-fill parking area is illustrated by a phantom line.

The storage-sensing function is driven by a bail arm profile 126 on a radially outward surface 128 of an arcuate ridge 130 on the front face 94 of the drive gear 56.

The start-stop function uses a start-stop profile 132 defined by the outside diameter of gear teeth 134. The gear teeth have a consistent diameter from the center axis of the drive gear, except that at one place there is a notch 136. This notch is approximately one half of the axial thickness of the gear teeth. For instance, if the gear teeth are 0.200 inch thick, forward to aft, then the notch is approximately 0.100 inch deep axially. Since the notch is not the full axial thickness, the pinion gear 54 is able to rotate the drive gear 56 a full 360 degrees.

Having described the various systems, functions, and piece parts, the assembly and function will now be described.

Figure 5A:
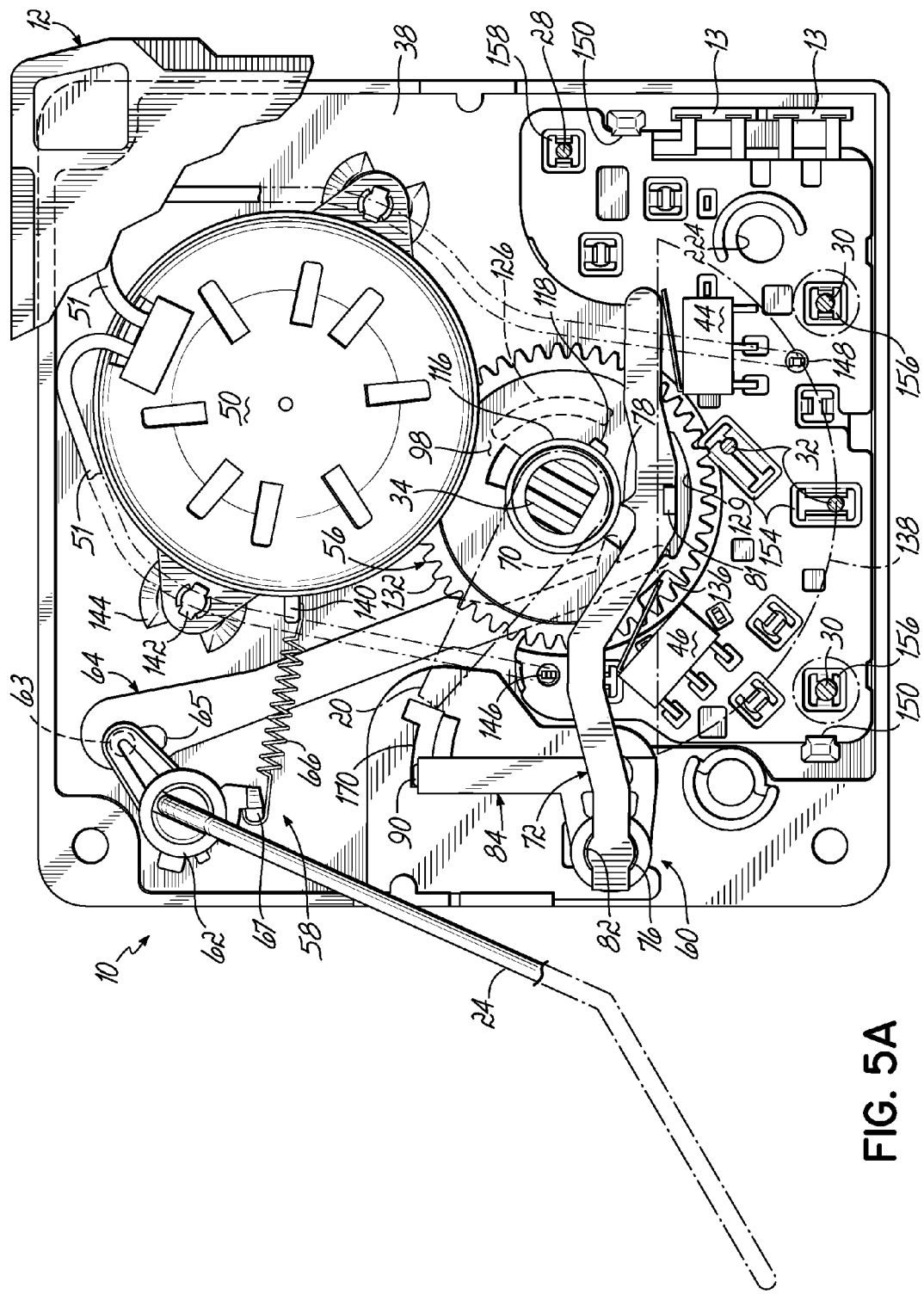
FIG. 5A-5F are back views partially broken away of the embodiment of the icemaker control module of FIG. 1, at various stages of an icemaker cycle.
Figure 13A:
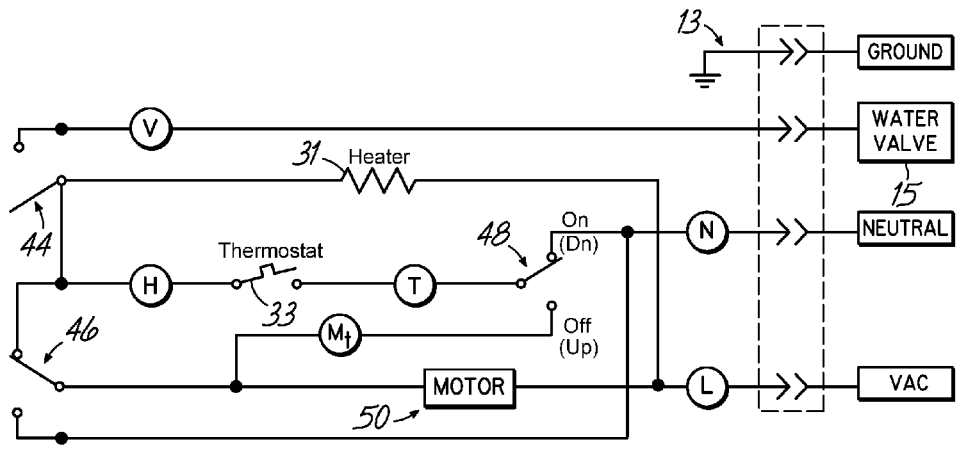
FIG. 13A through 13C are electrical diagrams of portions of the operating cycle of an icemaker control module of FIG. 1

FIGS. 5A-5F and 13A-13C illustrate the cycle of the icemaker control module 10 as seen standing in the control housing 12 and looking at the control module. In FIGS. 5A and 13A, the icemaker control module 10 is at its home state with the ejector 20 at approximately 200° and the cam follower 78 of the fill lever 72 resting on a cylindrical portion of the water fill profile 116. The water fill switch 44 is in its up or off position. The home switch 46 is in its up position resting within the notch 136 of the start-stop profile 132. The bail rod 64 is in its rest position and is not in contact with the bail profile 126. Shown in phantom lines is a half circular ice body 138. The protrusion 122 of water fill off profile 120 is hidden from view behind the fill lever 72 and the cam follower 80 is also hidden from view over the park area 124 of the water fill off profile 120. The bail arm 24 is in its down position indicating that the storage container is not so full that ice bodies blocked it from reaching the down position during the previous cycle. The bail arm 24 is snapped into the bail pivot 62 that is snapped into the base 38. The protrusion 63 of the bail pivot 62 is in the hole 65 of the bail rod 64 that is partially hidden behind the drive gear 56. The pin 68 of the bail rod 64 is guided by a feature (not shown) in the base 38. Spring 66 is connected from the appendage 67 to an anchor 140 on the base 38. The spring 66 applies a force rotating the pivot arm to bring the bail arm 24 into its lower position.

The insert molded circuit board 40 is snapped onto the base and is held by at least 2 clips 150 that push the base 38 against support features 39 (FIG. 11) that support the forward side of the insert molded circuit board 40. Test points 152, labeled with letters V, H, L, T, M, and N (visible in FIGS. 1, 2, and 13A-13C) at through holes in the forward side of the base are aligned with test points of the insert molded circuit board 40. These test points allow access to internal conductive portions of the circuit board for quality control and diagnostic testing of electrical components. The home switch 46, ice body storage level switch 48 and water fill switch 44 are retained and electrically coupled by the insert molded circuit board. The thermostat probes 32, heater-contacts 30, and the ground wire probe 28 of the icemaker are in contact and retained within the insert-molded circuit board at 154, 156, and 158 respectively. The test points 152 depend on customer requirements and are optional features.

Figure 7A:
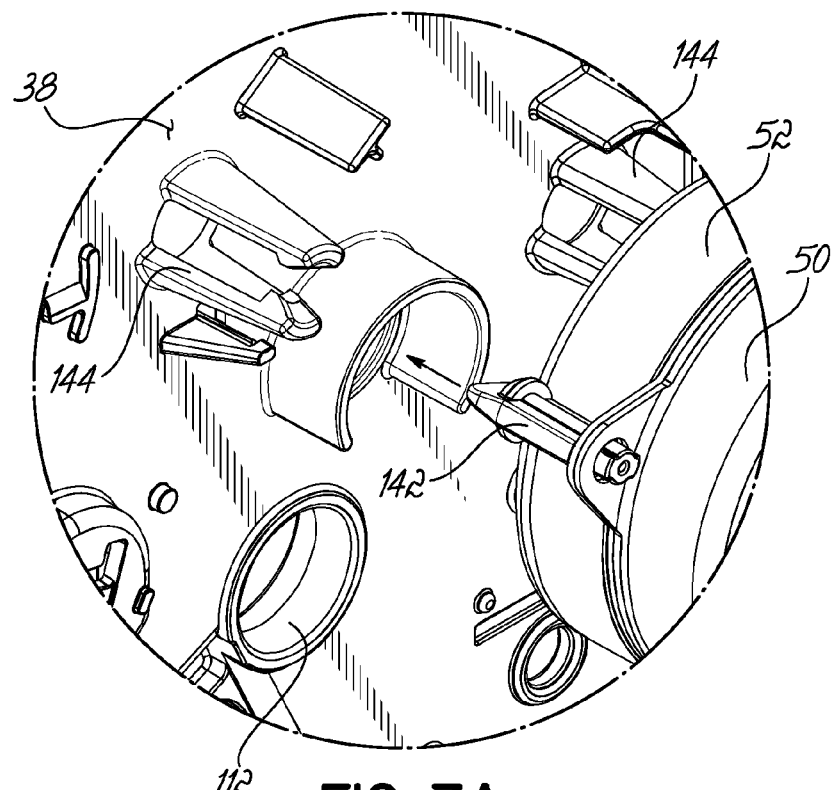
FIGS. 7A and B are detailed views of the motor and gear cup snapping into the base.
Figure 7B:
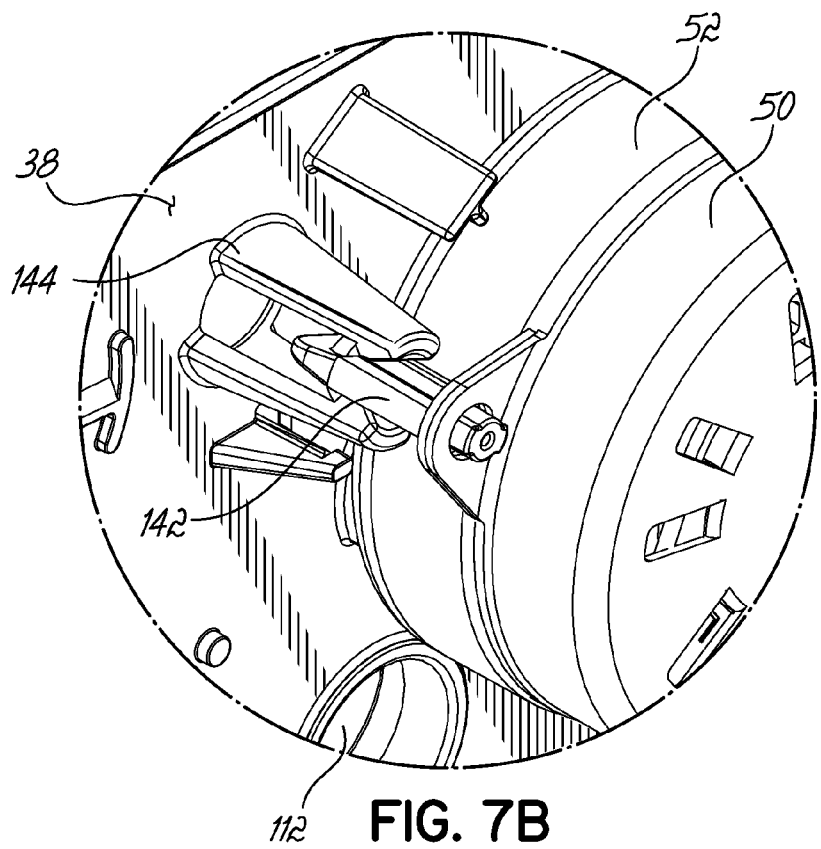

The gear cup 52 is made of plastic and advantageously offers improved sound suppression. The plastic has two round snap members 142 snapped into the base 38 at two conical snap receivers 144. FIGS. 7A and 7B show this in greater detail. Two pre-tinned electrical leads 51 from the motor assembly 50 are pushed into the insert molded circuit board 40 at locations 146 and 148 where they are retained and make electrical contact. This is shown in greater detail in FIG. 10.

The fill lever 72 is snapped into the water fill adjust lever 84 in a manner that allows rotation between the two. The retainer 90 is passed through to the forward side of the base 38, and the water fill adjust lever 84 is snapped into aperture 92, in a manner that allows rotation. The aft facing spacer 81 guides and properly spaces the fill lever 72 relative to the control housing.

Figure 5B:
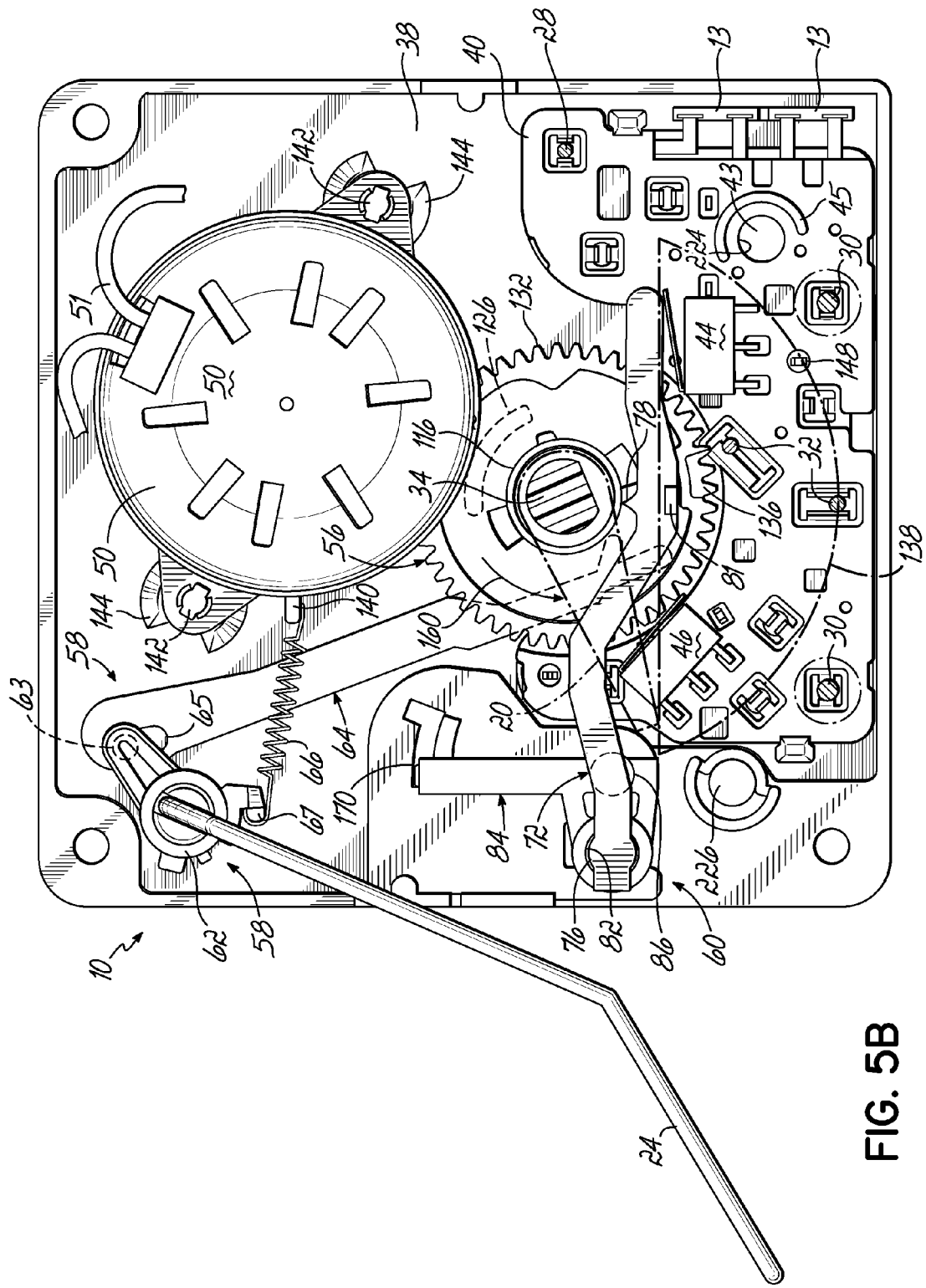
Figure 6:
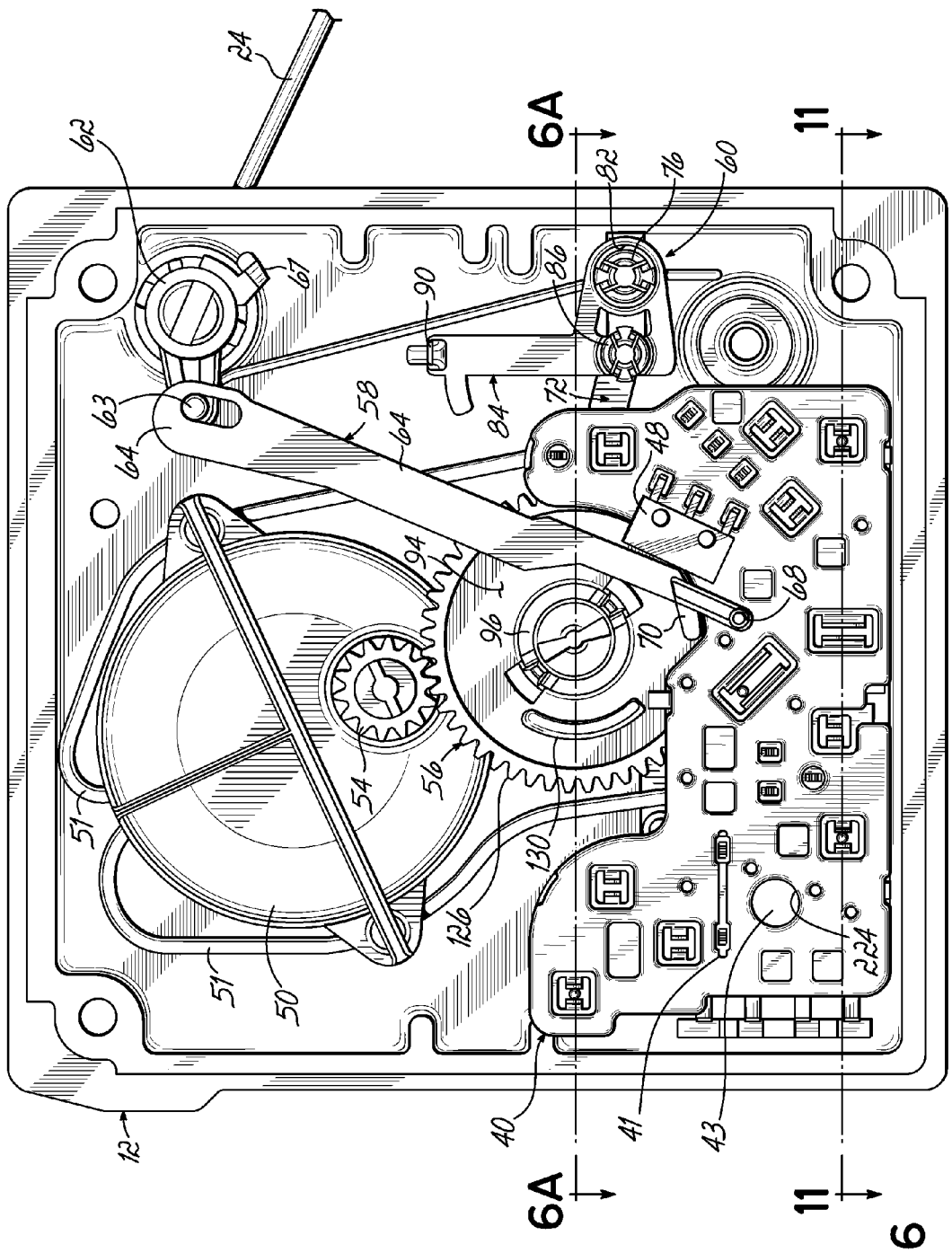
FIG. 6 is a front view of the embodiment of the icemaker control module of FIG. 1, with the base removed for clarity.
Figure 6A:
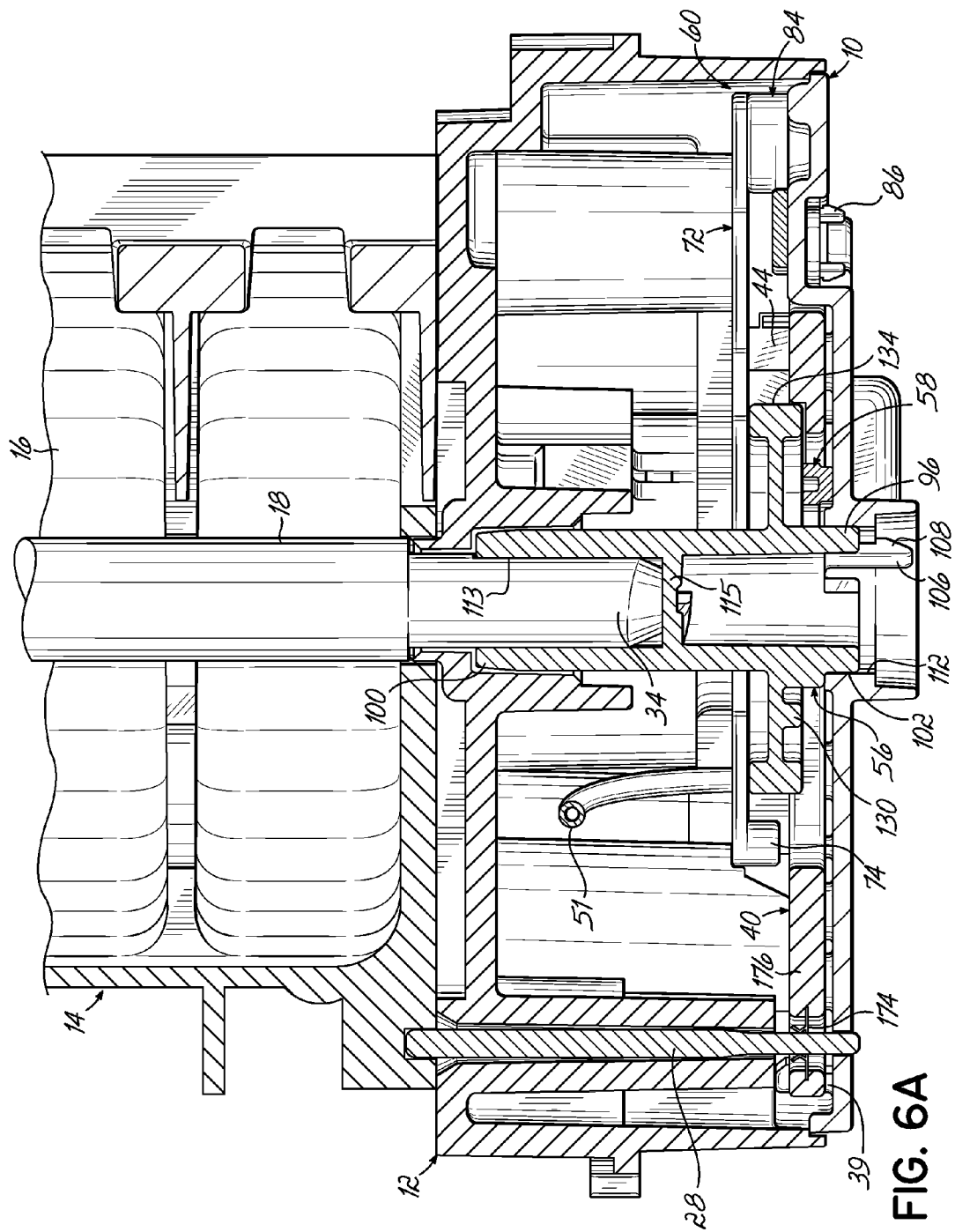
FIG. 6A is cross-section view taken in line 6A-6A of FIG. 6.
Figure 13B:
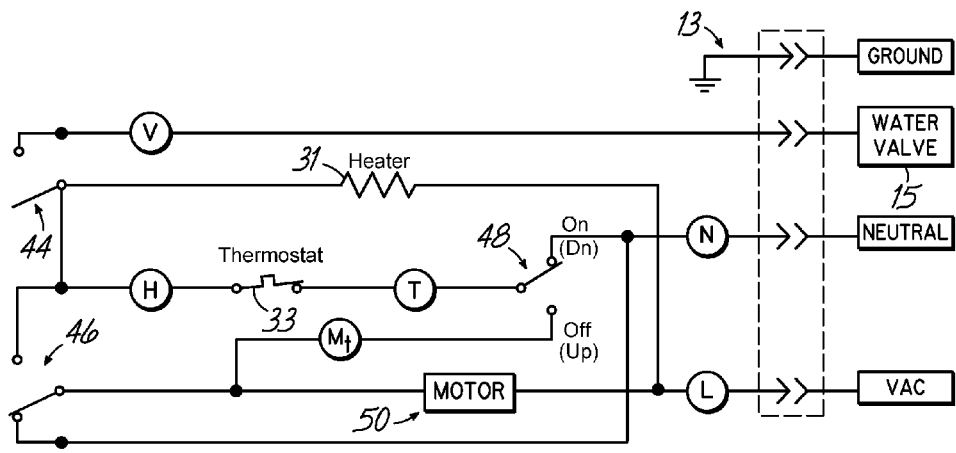

In FIGS. 5B and 13B the cycle has begun in response to the thermostat 33 closing when it sensed the ice bodies 138 in the mold were frozen and ready to be harvested. The thermostat 33 allowed current flow to the heater 31 to warm the mold to loosen the ice bodies, and current to the motor assembly 50 to rotate the drive gear counterclockwise as indicated by the arrow 160. During a period of time, the ejector 20 has traveled from the position shown in FIG. 5A, to the position of FIG. 5B where it is making contact with the top surface of the ice body. The home switch 46 is no longer in its up position within the notch 136 but is instead in its down position because it is compressed by profile 132 of the gear teeth.

Figure 5C:
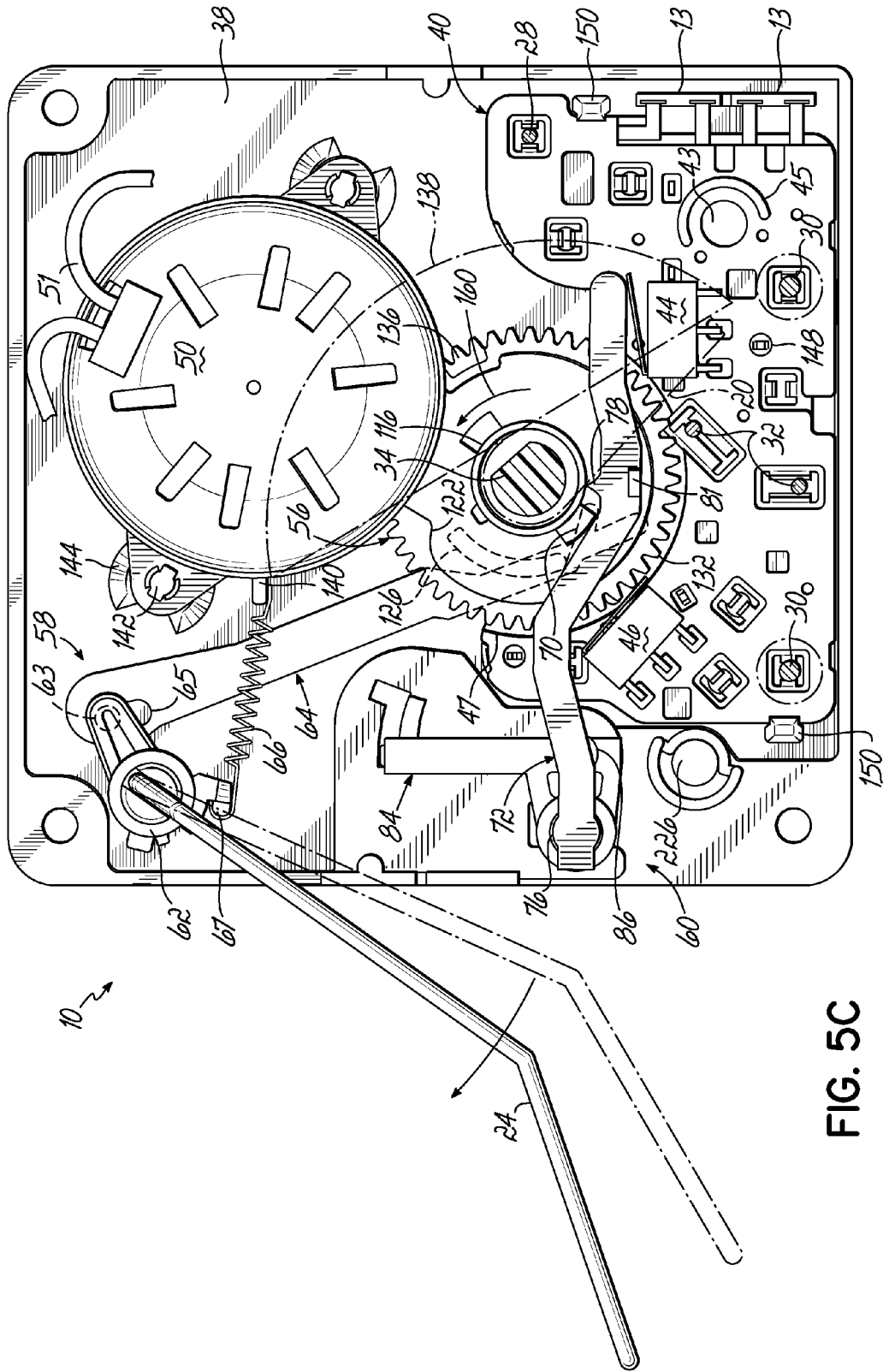

FIG. 5C continues the cycle with the ejector having scooped the ice body mostly out of the ice mold. Bail profile 126 has rotated and made contact with cam follower 70, and has started to pull down on the bail rod 64. The bail rod rotates the bail pivot 62 that starts to raise bail arm 24 while stretching spring 66.

Figure 5D:
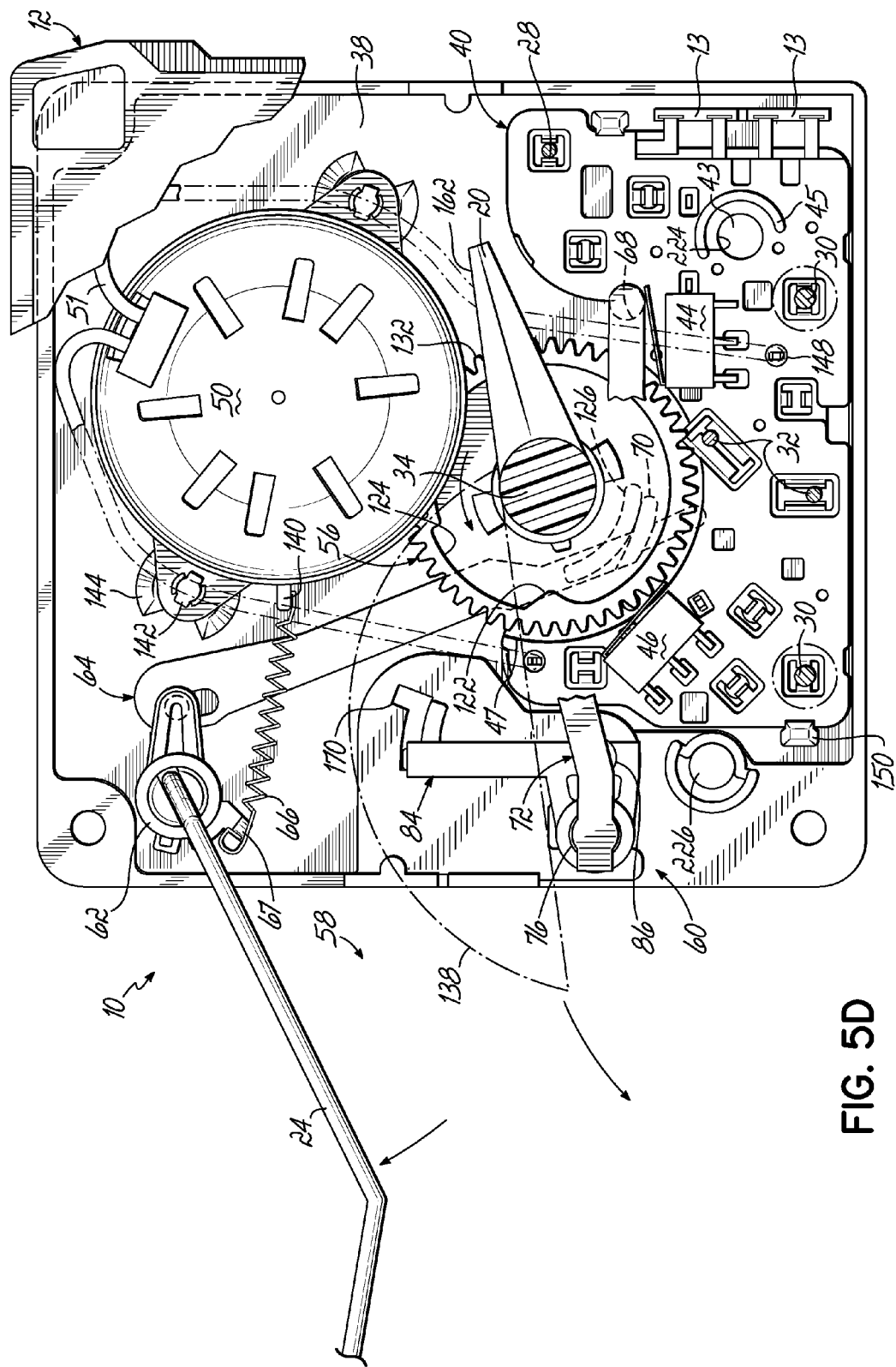

In FIG. 5D, the fill lever 72 is partially removed to allow a better view of the bail rod. Continued rotation has brought the bail arm 24 higher, as the cam follower 70 is pushed by the bail profile 126. The ice body (actually all the ice bodies on a series of ejectors along the shaft) has been brought onto what is now an upward facing surface 162 of the ice ejector 20. Gravity causes the ice body to slide off the ejector and under the raised bail arm 24. If the storage container has room, the ice bodies will fall into the storage container and away from the bail arm 24.

Through the previous figures, cam follower 78 of the fill lever 72 has been near to or in contact with profile 116 on the drive gear. This profile is generally round, but it may also be made sloping, especially as it nears protrusion 118.

Figure 5E:
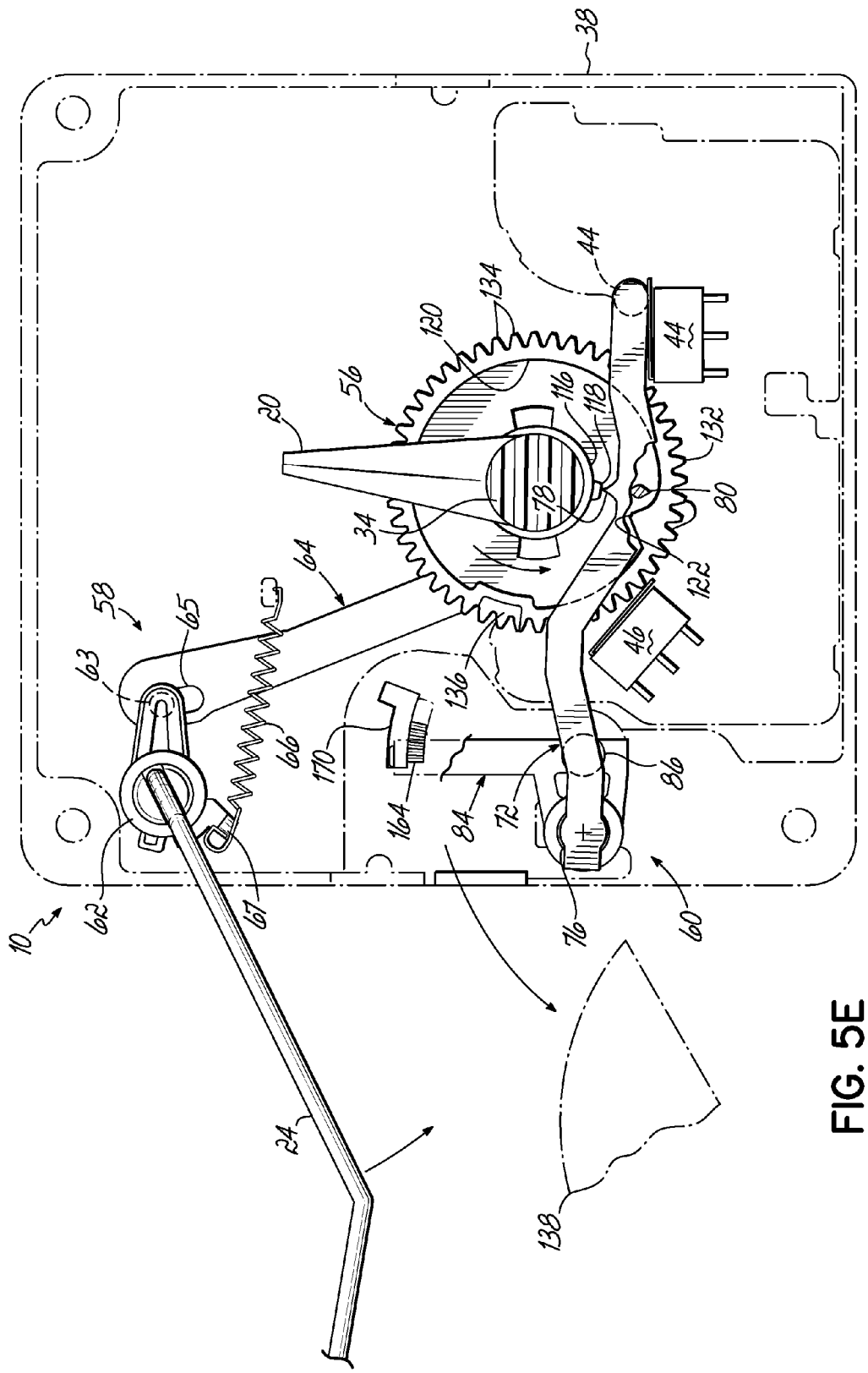
Figure 13C:
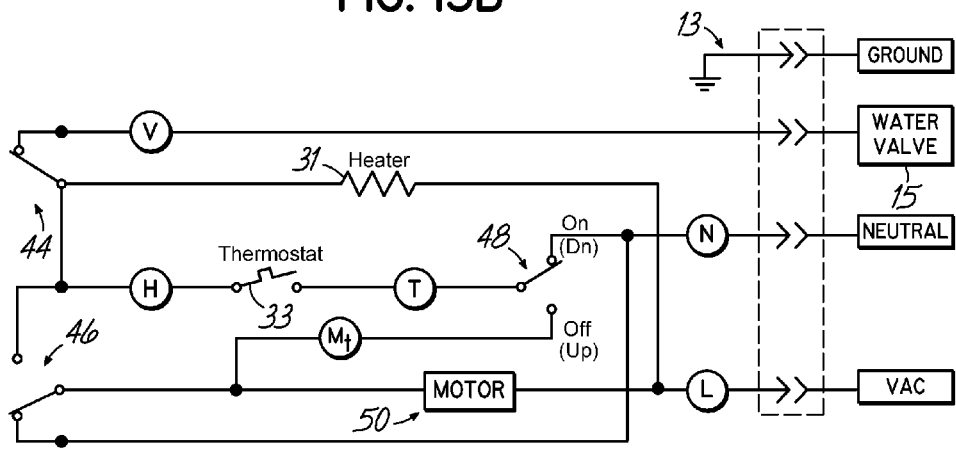

In FIGS. 5E and 13C protrusion 118 has caused the fill lever 72 to push down with contact 74 against fill switch 44, overpowering the internal spring force of the switch. Fill switch 44 sends electric current to a water supply valve 15 in the supply line to the icemaker, so that the valve will allow water to flow. Water will flow for as long as the fill switch 44 is depressed. It is contemplated that if needed, other timing interlocks could be put in the circuit to prevent water flowing an unreasonable length of time, and thus flooding the icemaker. The ice body proceeds to the storage container, spring 66 lowers the bail arm 24, and contact 69 actuates the ice body storage level switch 48.

Figure 5F:
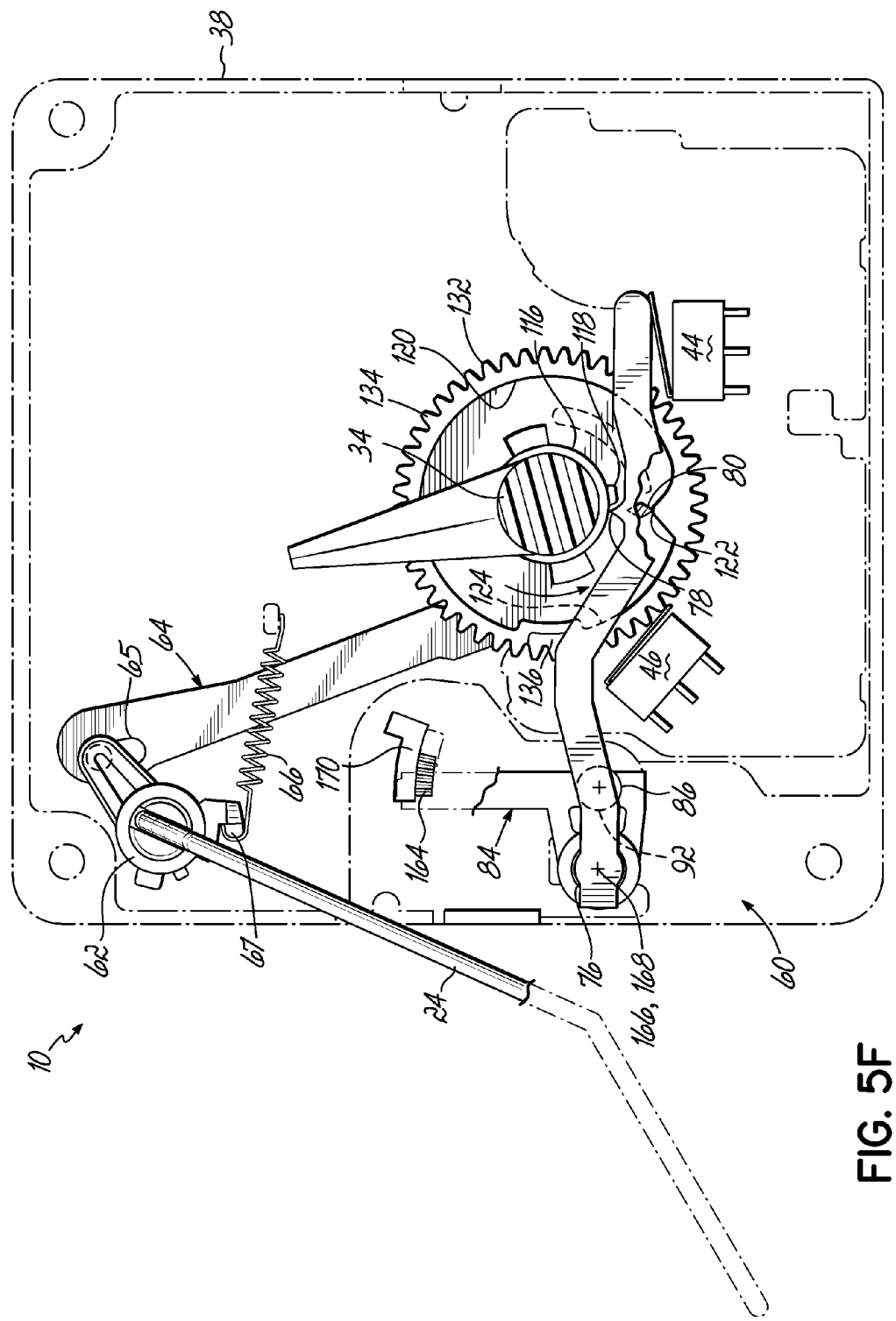

In FIG. 5F, protrusion 118 has moved past cam follower 78, and the internal spring of fill switch 44 has re-opened the switch, stopping the water flow, and raising the fill lever 72. Protrusion 122 pushes the fill lever 72 up at cam follower 80. This protrusion 122 is an assist or a backup for the internal spring force of fill switch 44 to return the fill lever 72 to the up position. The switch may have enough spring force to move the lever itself, or protrusion 122 may perform the lifting. The switch pushes the fill lever 72, but the fill lever 72 does not pull the switch.

After FIG. 5F, the harvesting cycle completes by returning to the position shown in FIG. 5A. The motor assembly 50 stops when home switch 46 returns to its up position in notch 136. Cam follower 80 is at rest above park area 124 of water fill off profile 120. It is contemplated that by varying the height of park area 124, as shown as 124a (FIG. 4B) contact can be maintained with cam follower 80, as a way to prevent unusual situations where fill lever 72 may depress water fill switch 44. The icemaker will remain stationary until the start of the next cycle that will begin if two conditions are met: First, the bail arm 24 is in the down position, and second, the thermostat senses that the ice bodies are ready to be harvested.

Figure 5G:
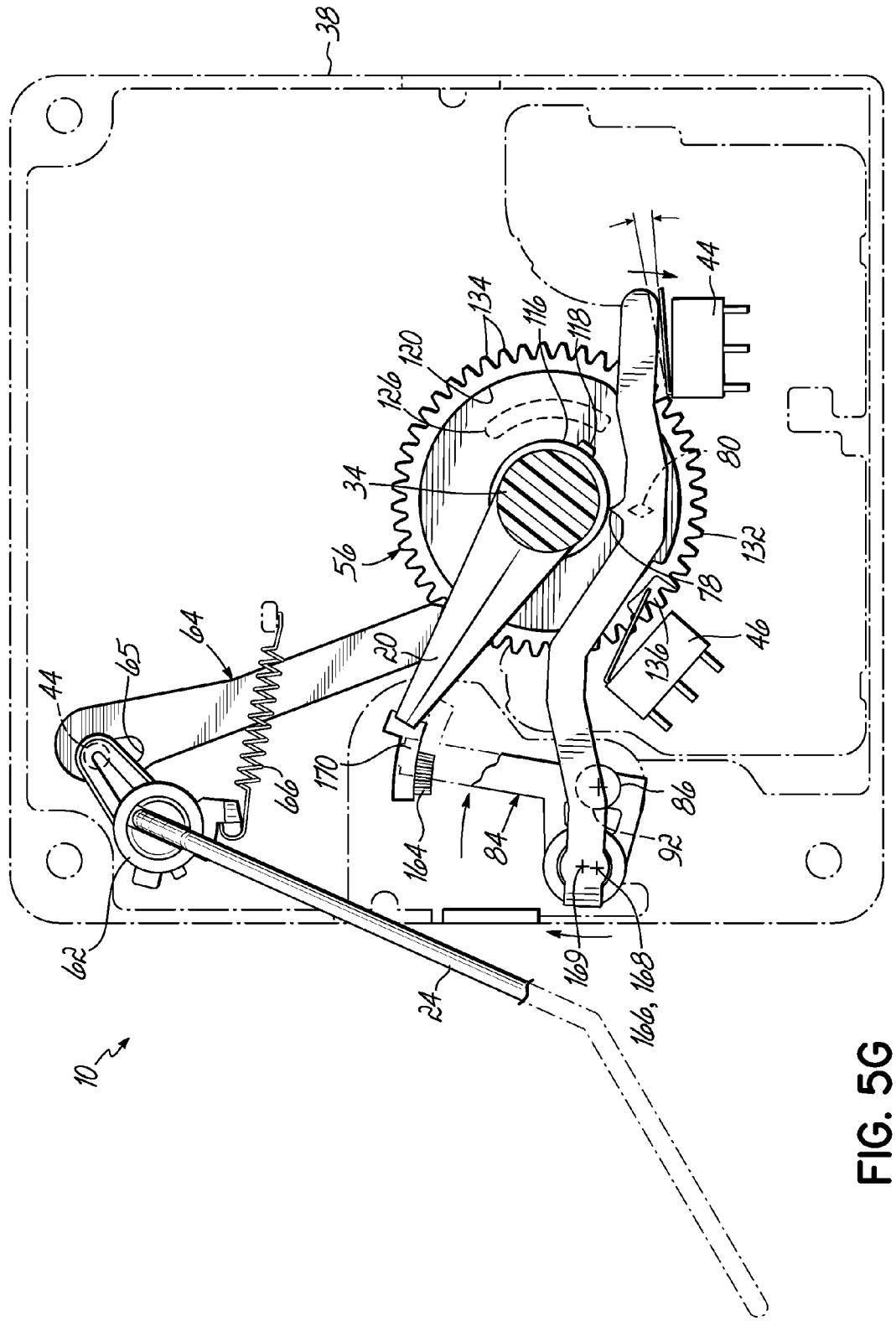
FIG. 5G is a partial back view of the embodiment of the icemaker control module of FIG. 1, to illustrate an adjustment of the water fill feature.

FIGS. 5F and 5G illustrate the water fill adjustment capabilities of this design. In FIG. 5F, the tooth of the fill adjustment lever fits into one of the left most plurality of ratchet teeth 164 of the base. This positions the pivot point 166 between the fill lever 72 and the fill adjustment member at a first position 168 relative to aperture 92 in the base, and therefore also relative to the center axis of the drive gear. By moving the tooth of the fill adjustment lever to a different position on the ratchet teeth 164, as in FIG. 5G, the pivot point moves to a second position 169 (FIG. 5G). Although both positions have the same radial distance from aperture 92, they have different vertical and horizontal distances from aperture 92, and the center axis of the drive gear. This repositioning between 168 and 169 causes a different positioning of contact 74 on fill switch 44, for a given amount of rotation of the drive gear.

The pivot shown in FIG. 5F is considered "low" relative to the "high" position shown in FIG. 5G. When the pivot point is at its fully low position, the fill lever 72 is at a maximum resting distance off the fill switch. This means that as the drive gear rotates and the water fill profile 116 reaches the cam follower 78, it takes longer for the fill lever 72 to depress the fill switch. When in the "high" position of 5G the fill lever 72 rests closer to the fill switch 44 so that when protrusion 118 reaches the cam follower 78, the fill switch 44 depresses earlier during the cycle, for a longer water fill time. Therefore, the adjustment feature of the fill adjust lever is that when far to the left, water fill times are at their minimum and when far to the right, they are at their maximum. For example, when far to the left, the fill time for the ice tray is approximately 5 seconds and when far to the right, it is approximately 10 seconds. The approximate 1.5° increments of the ratchet teeth 164 in the base account for a change of approximately one second each. This is a feature that may be adjusted in the factory, or in the home when it is necessary to increase or decrease the size of the ice bodies. Beneficially, it is easy to view the current position of adjustment by simply looking at the position of the fill adjust lever relative to the window 170 in the base adjacent to the ratchet teeth 164. In FIG. 2, the letters H and L in the base make the adjustment position visible from the outside of the icemaker control module, and the adjustment can be made without removing the icemaker control module 10 from the control housing 12.

FIG. 6 shows the icemaker control module from the opposite direction, that is, from the front looking to the back. The base has been removed for clarity so the moving parts can be seen.

FIGS. 7A and 7B are a detail view of the motor assembly 50 including the gear cup snap mounting to the base as previously described. The snap engagement between the two pieces is approximately 0.050 inches. The plastic gear cup's integral reinforcing rib 143 (FIG. 3) between the snap members 142, and the open-sided receivers 144 enhance the precision and efficiency of assembly, and the stability of the pinion gear meshing with the drive gear 56.

Figure 8:
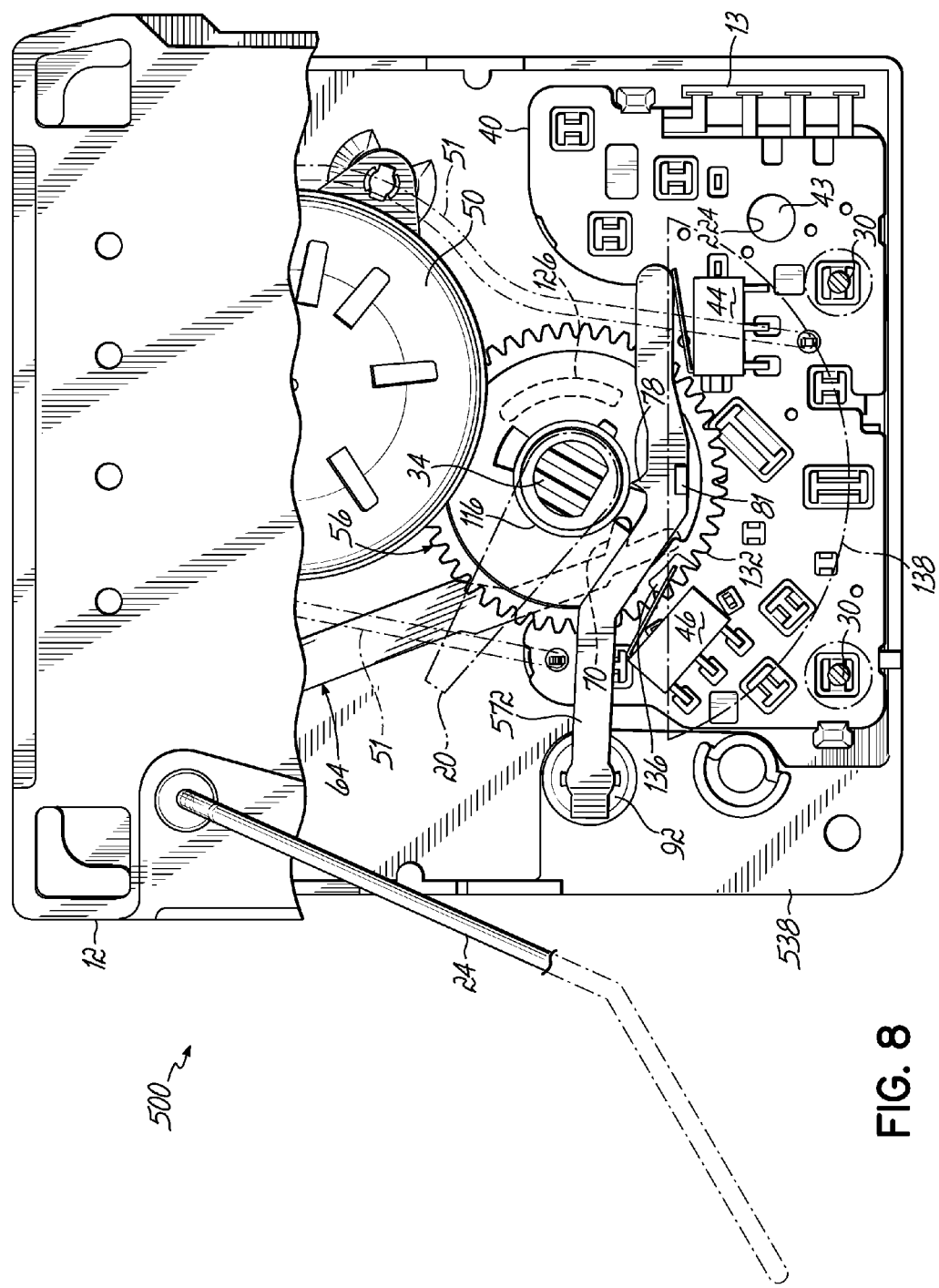
FIG. 8 is a back view of a second embodiment in which the water fill is not adjustable.

FIG. 8 illustrates a non-adjustable water-fill embodiment of an icemaker control module 500 having a base 538. In this embodiment, water-fill lever 572 is shorter than fill lever 72 of embodiment 10. Fill adjust lever 84, window 170, and ratchet teeth 164 are not present. Water-fill lever 572 snaps directly into aperture 92 in the base.

Figure 9:
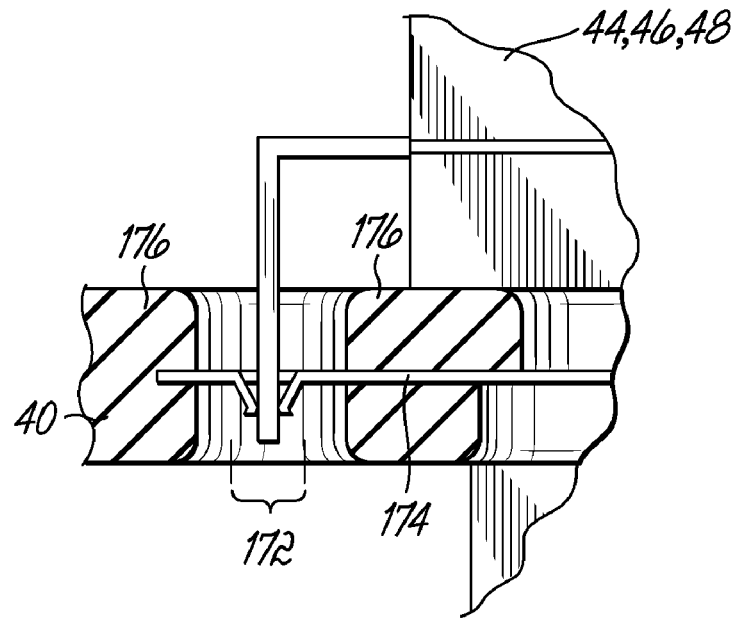
FIG. 9 is a detailed view of the connection of electrical switches within an icemaker control module.

FIG. 9 is a close-up of a lance feature 172 that retains the electrical switches 44, 46, 48. The conductive material 174 enclosed between molded plastic 176 is formed with a gap of approximately 0.012 inches between the two sides of the lance feature. This receives a switch having conductors of approximately 0.016 inches.

Figure 10:
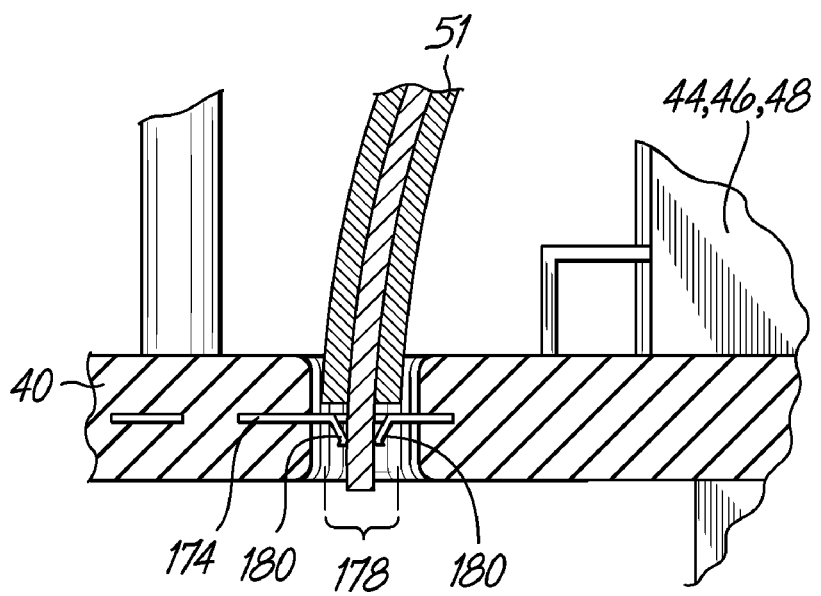
FIG. 10 is a detailed view of the connection of electrical components within an icemaker control module.

FIG. 10 is a close-up of a lance feature 178 that retains the motor leads 51. The conductive material 174 enclosed between molded plastic 176 is formed with a gap of approximately 0.017 inches between the two sides of the lance feature. This receives a wire of approximately 0.030 inches.

It is evident to one of ordinary skill in the art that the principles shown for these two sizes can be extrapolated to retain conductors of various sizes. The sharp edges 180 of lance features 172 and 178 retain the electrical components and prevent removal. Lance features 172 and 178 are for easy assembly, but disassembly is not easy. There are no fasteners necessary to maintain assembly other than the lance features.

Figure 11:
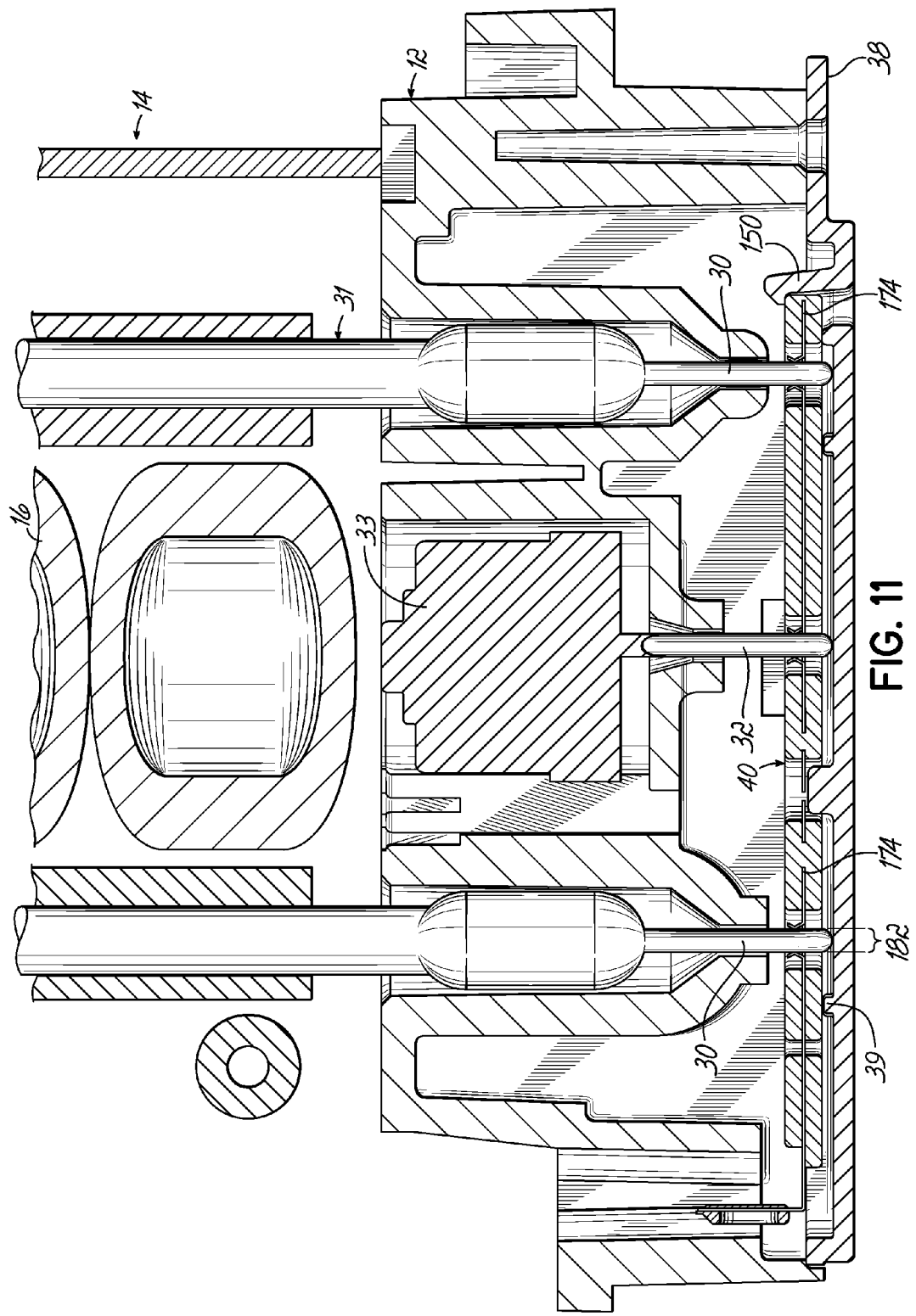
FIG. 11 is a cross-section taken at line 11-11 of FIG. 6.
Figure 11A:
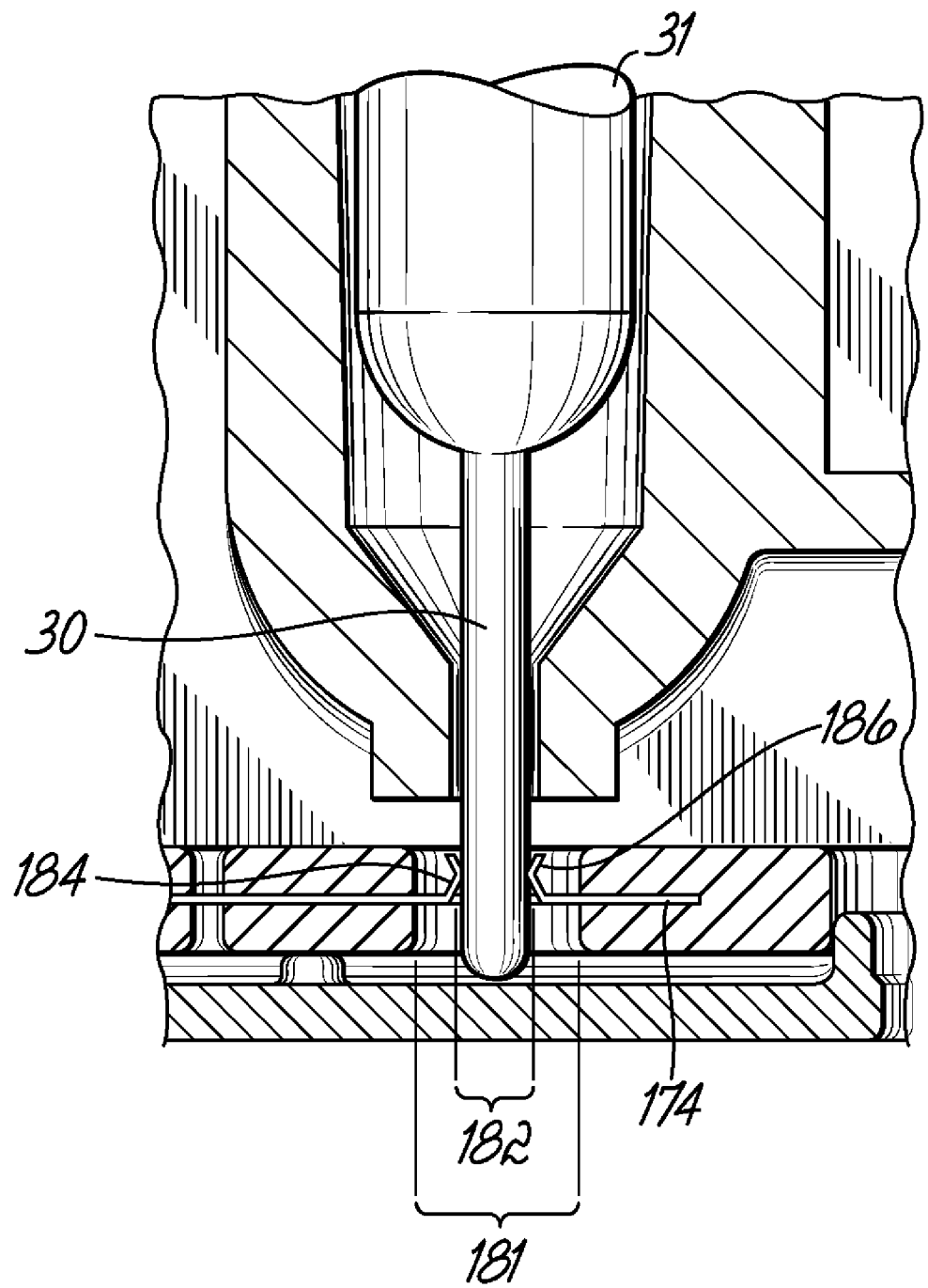
FIG. 11A is a detailed view of a portion of FIG. 11.

FIGS. 11 and 11A illustrate connective features 181 that are meant for easy assembly as well as disassembly. The conductive material 174 in these figures is formed to create a gap 182 between the two pieces of a first portion 184 but sharp edges are avoided by forming a second portion 186 in the opposite direction of 180 to create a lead-in. Connections of this style are for the ground wire 28, two heater-contacts 30, and two thermostat contacts 32. Connection is made when the icemaker control module 10 is installed in the control housing 12 and held by fasteners (not shown). By way of an example, a thermostat probe 0.090 inches wide slides into a gap 182 of approximately 0.086 inches.

The icemaker control module eliminates point to point wiring that requires time-consuming manual assembly with its inherent propensity for quality errors. This improved manufacturing process will be described starting with the insert-molded circuit board, and continuing through the attachment to the icemaker. The insert molded circuit board may be manufactured in a "cell" consisting of a stamping die and press for the conductive material, a die to separate the copper traces and parts after molding, and a transfer system to move the components from one machine to the next within the "cell". The process may be done in a continuous feed and stamping system, using a roll of material, or it may be done with discreet portions of flat material. For purposes of illustration, a process using a sheet that provides for four insert molded circuit boards 40 is described.

Figure 12A:
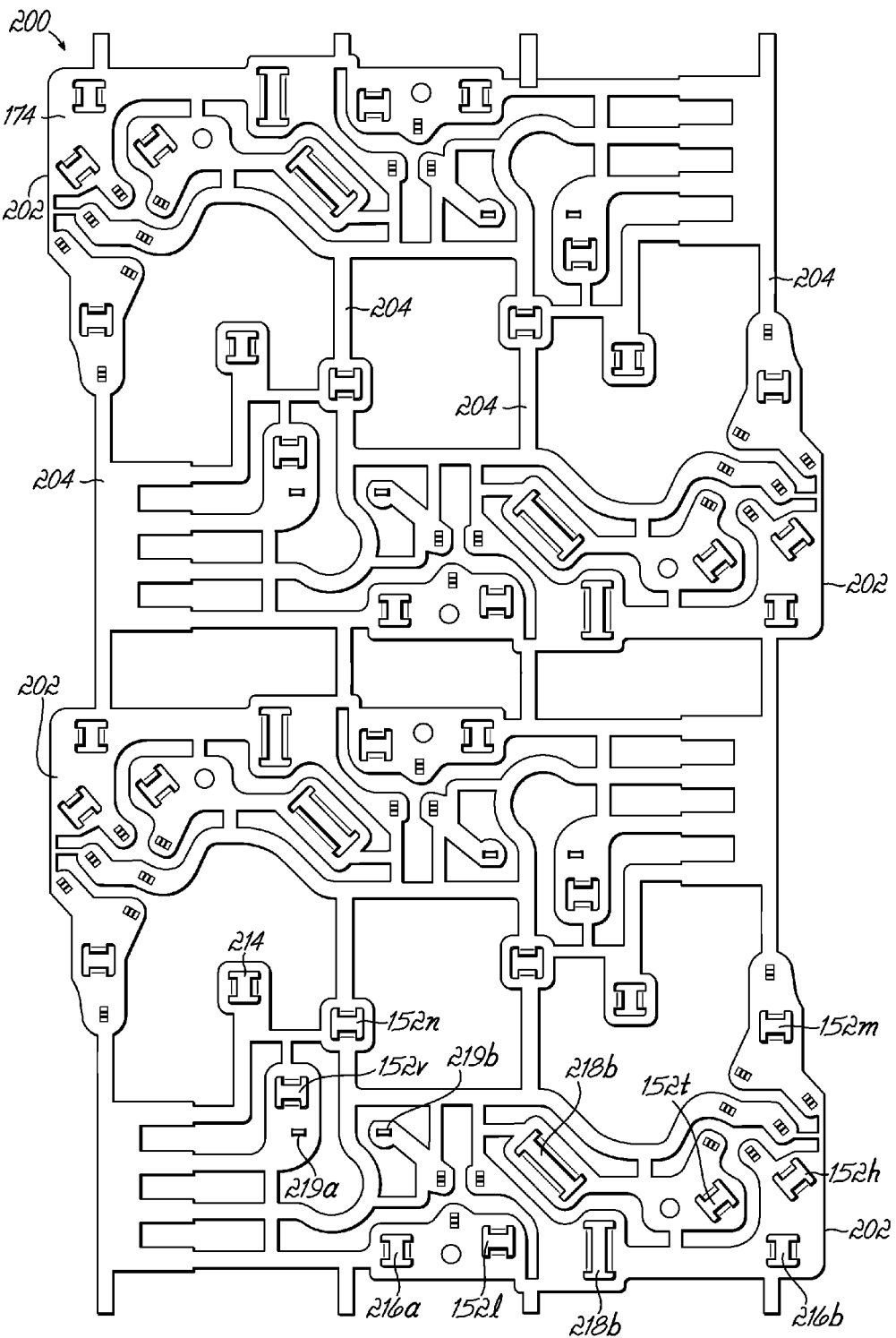
FIG. 12A through 12E are views of the manufacturing stages of an insert molded circuit board.
Figure 12B:
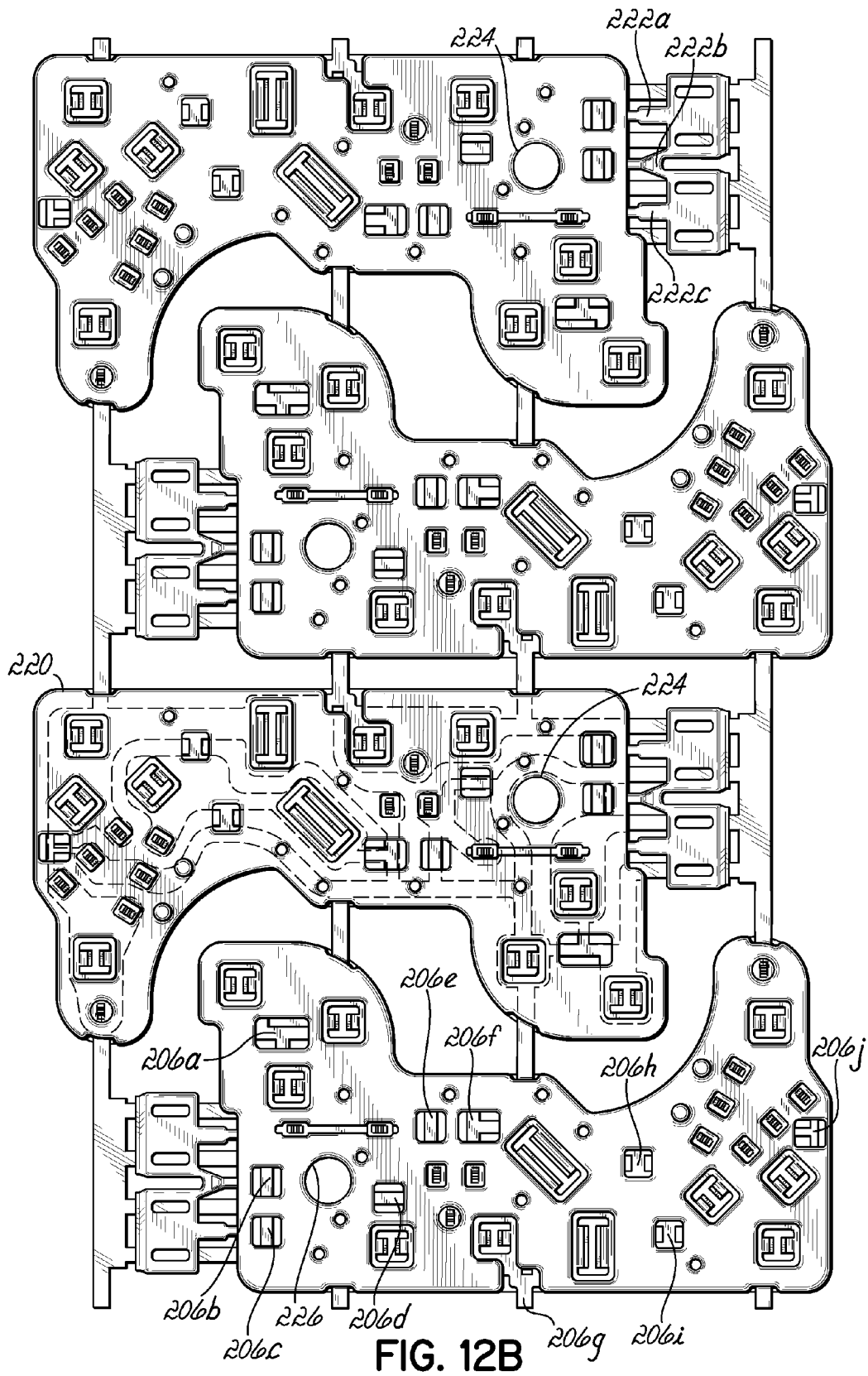
Figure 12C:
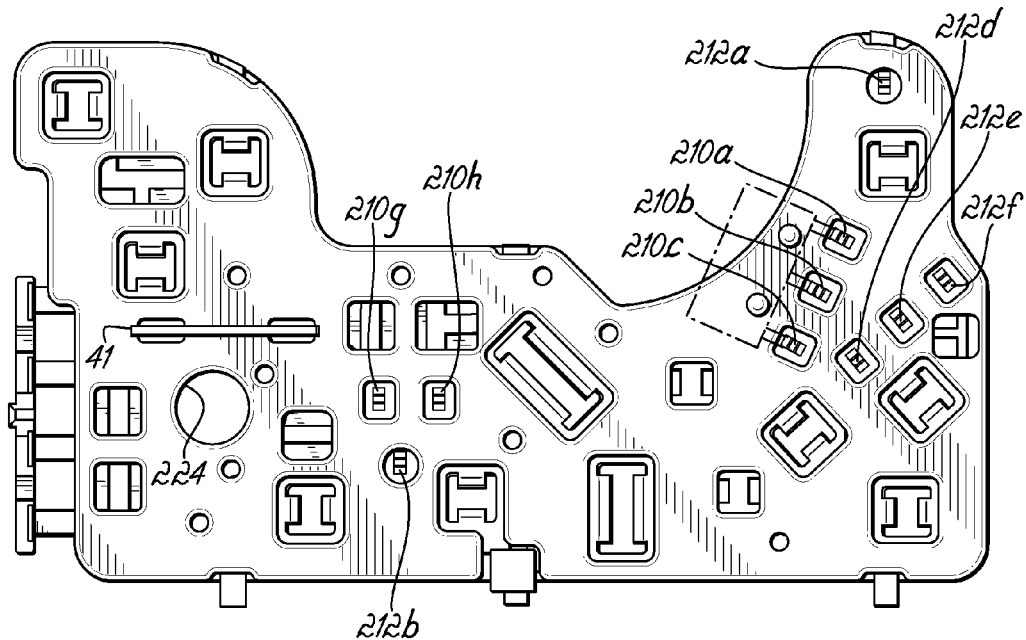
Figure 12D:
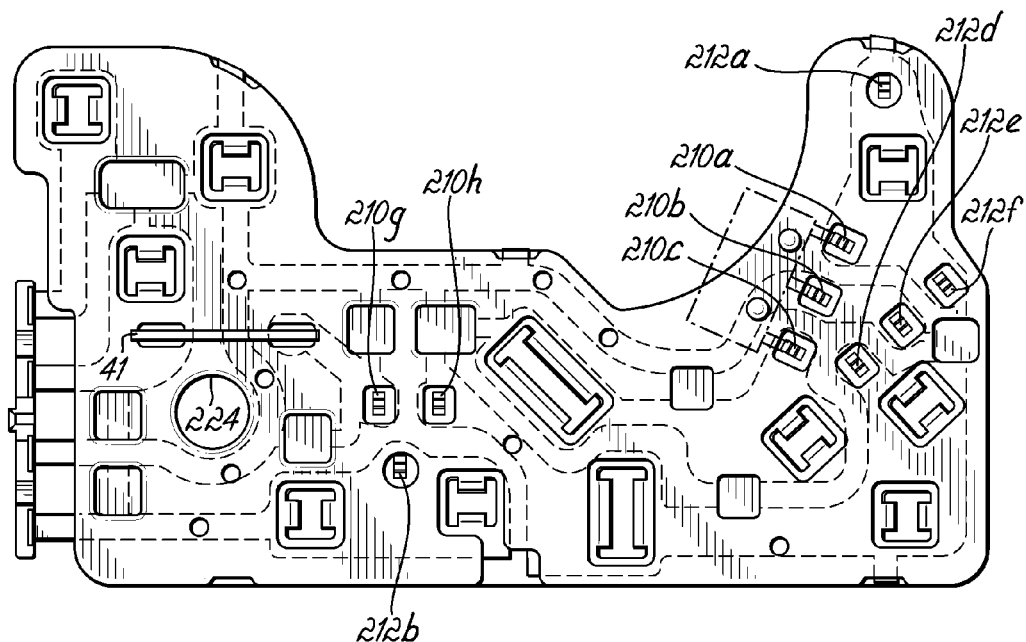
Figure 12E:
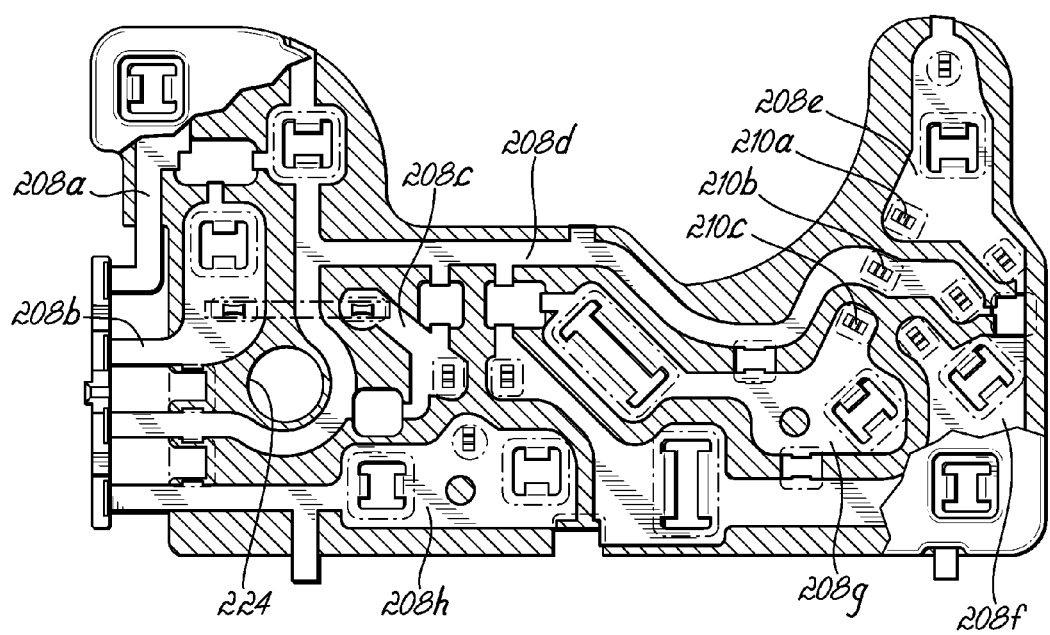

As illustrated in FIG. 12A, a flat sheet 173 (not shown) of a conductive material 174, such as copper, is cut and formed into a patterned sheet 200 that will become four circuit boards 202 that will be made into four insert molded circuit boards 40. The four circuit boards 202 are nested, or arranged, in pattern sheet 200 in an orientation that conserves material and reduces waste. The cutting and forming may be advantageously performed by a punch press in a manufacturing cell having transfer equipment that moves the material from one station to another. There are four external busses 204 that connect each circuit board 202 to another. There are also ten internal busses referred to as bus connectors 206 (specifically 206a through 206j ref. FIG. 12B) that keep each of eight separate traces 208a through 208h (ref. FIG. 12E) connected within a circuit board 202. The external busses 204 and bus connectors 206 maintain spacing while the patterned sheet 200 is subsequently processed.

The lance features 172 that will retain the switches 44, 46, 48, and the lance features 178 that will retain the motor leads 51 are formed in the circuit board 202. The lance features 172 for the switches are 210a through 210h. The lance features 178 for the motor leads 51 are 212a and 212b (FIG. 12D)

The connective features 181 that will retain the ground wire 28, the two heater-contacts 30, and the two thermostat contacts 32 are also formed in the circuit board 202. The connective features 181 for the ground wire 28 is 214, for the heater-contacts 30 they are 216a and 216b, and for the thermostat contacts 32 they are 218a and 218b respectively.

Two apertures 219a and 219b are formed in the circuit board 202. These will receive bus pin 41. These apertures are of a shape that works with the chosen configuration for bus pin 41.

Figure 14A:
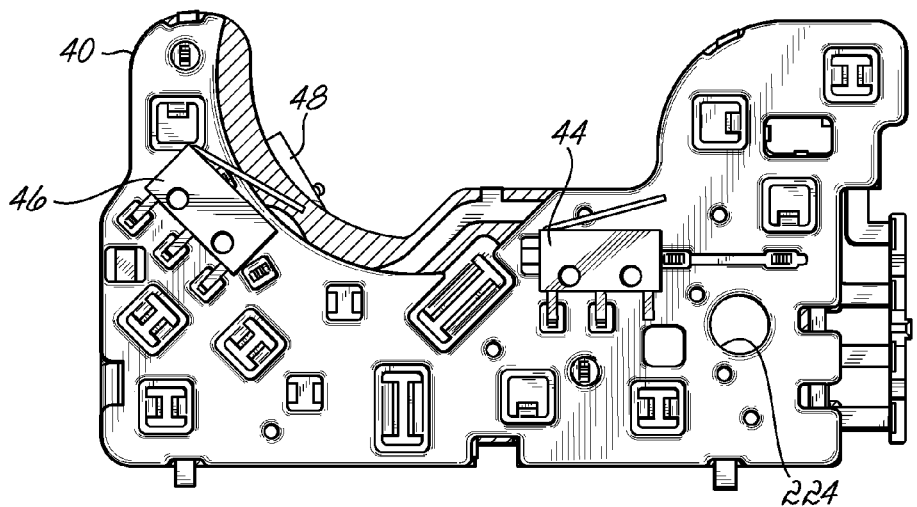
FIG. 14A, 14B, 14C are interior views of the conductive material in one circuit board of the icemaker control module of FIG. 1.
Figure 14B:
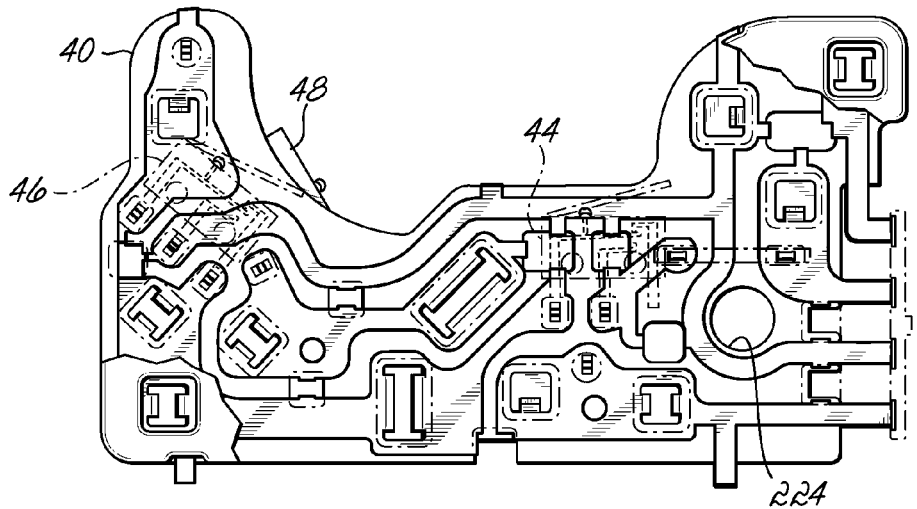
Figure 14C:
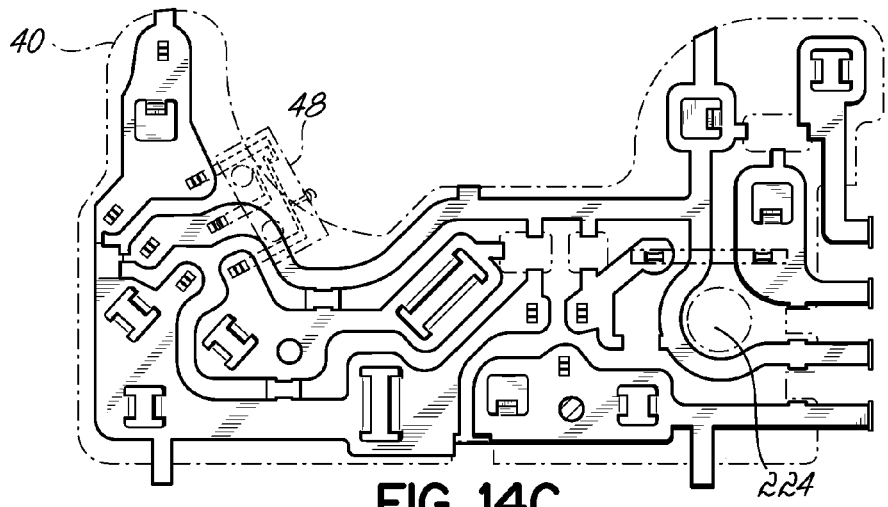

The six test points 152 that were described with respect to earlier figures are also formed in the circuit board 202. They are identified (ref. FIG. 12A) specifically as 152H, 152L, 152M, 152N, 152T, and 152V. Respectively, they are for Heater, Live wire, Motor, Neutral, Thermostat, and water Valve. The alphanumeric identifiers 152h, 152l, 152n, 152m, 152*t*, 152*v* used in the figure are consistent with their names and functions make it easier to read this description. The test points 152 are also visible in FIGS. 13 and 14.

After the cutting and forming to make the circuit board 202, a plastic 220 (FIG. 12B) is molded around each of the four circuits 202 while the traces 208 are properly spaced by the busses 206. The plastic 220 is not allowed to cover the lance features, the connective features, the bus pin apertures, or the internal bus connectors. Access hole 224, aligned with access hole 43 in case 38, is formed in the plastic 220. The plastic forms temporary plastic sprues 222*a*, 222*b*, and 222*c* at the connector 13.

After the plastic is solidified, the circuit board 202 is trimmed of its excess plastic and conductive material. Specifically, the four insert molded circuit boards 40 are cut from each other by removal of the external busses 204. The eight traces 208, supported in position by the plastic 220, are separated by removal of bus connectors 206 leaving windows through the plastic. The plastic sprues 222 are cut away, and busses 208*a, b, d*, and *h* are bent so that the connector 13 is at approximately a right angle from the orientation of the rest of the conductive material 174. All of these cuts and bending may be formed within an automated cell that can transfer and rotate the insert-molded circuit boards as needed. Advantageously, the trimming and bending may be done simultaneously.

Next, the eight electrically separate traces 208*a* through 208*h* are modified to create only seven. To do this, bus pin 41 is installed between aperture 218*a* and 218*b* so that trace 208*c* is for all practical purposes eliminated. It is now electrically combined with trace 208*b*. Bus pin 41, and its fastening process in aperture 219*a* and 219*b* may be done by any one of a variety of conventional methods, such as by staking or soldering. It may also be a lance feature similar to 176 or 178.

The ice body storage level switch 48 is installed to the insert-molded circuit board 202 on the same side as bus pin 41.

On the opposite side, water fill switch 44 and home switch 46 are installed into the lance features 172. This may be done now, or it may be done later as will be described. If done now, the insert molded circuit assembly 49 is complete.

The entire module 10 is designed to be built by straight (perpendicular) axial and rotary placement of all components onto the same side of the base 38, as already described with reference to previous figures. Assembly is simple and very easy to automate. Components snap in place and do not require fasteners.

The entire module 10 connects with the control housing 12. When connecting, the thermostat probes 32, ground wire 28, and heater-contacts 30 make contact with the connective features of the insert-molded circuit board. The drive gear 56 connects with the ejector shaft end 34. All these connections occur as an incident of pushing of the module onto the housing.

During disassembly, such as for service, access may be gained in two ways. First, the control module may be removed from the housing. Second, the housing, with the control module installed, may be removed from the icemaker mold. An access hole 224 aligned with hole 43 in case 38, and an access hole 226 (FIG. 2) align with similar holes in the control housing 12. This allows fasteners that hold the control housing to the icemaker mold to be removed or installed. The entire control housing with the module installed may be removed from the icemaker. This type of disassembly is advantageous for replacing the heater 31 or thermostat 33. As an incident of assembly and disassembly, the thermostat probes 32, ground wire 28, and heater-contacts 30 make contact with the connective features, while the drive gear 56 connects with the ejector shaft end 34.

Figure 15:
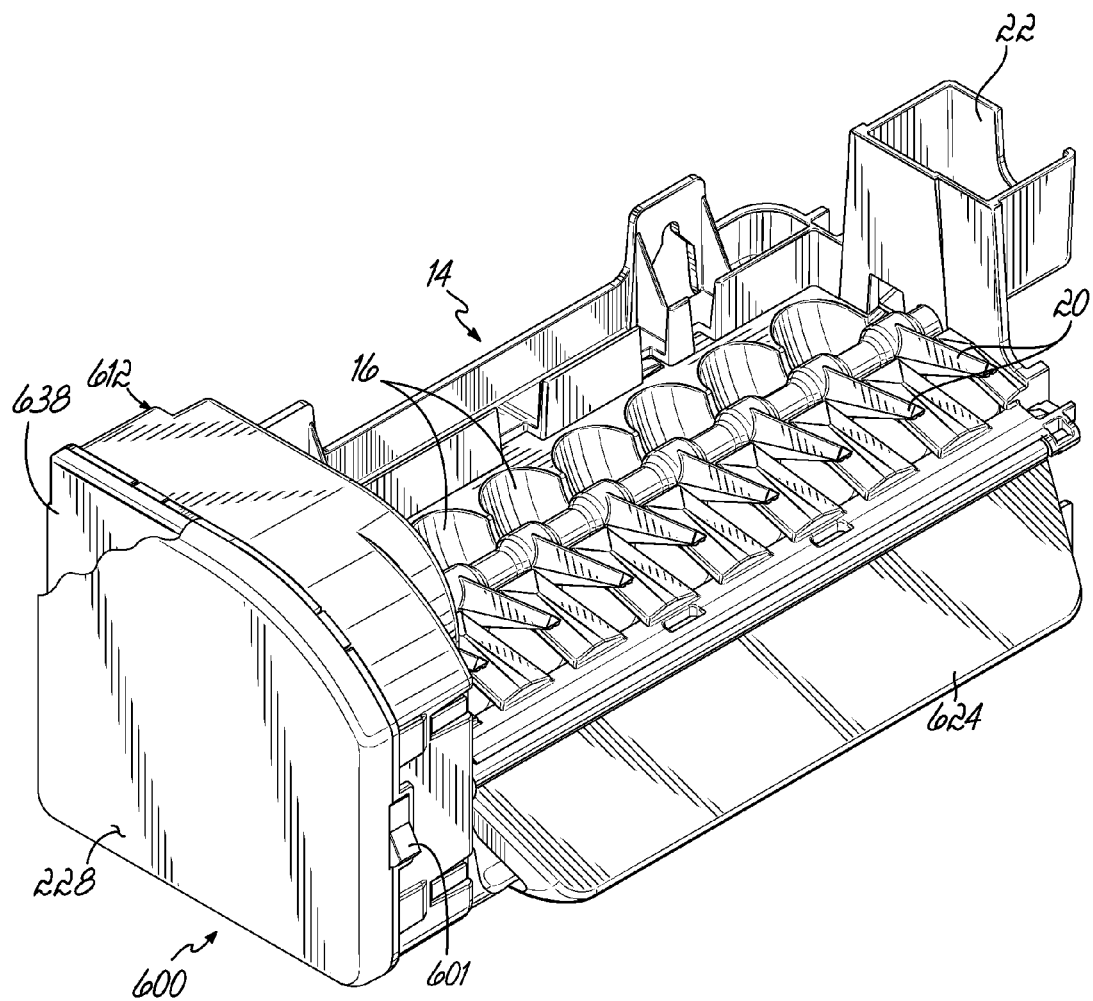
FIG. 15 is a perspective view of a third embodiment of an icemaker control module affixed to an icemaker.
Figure 16:
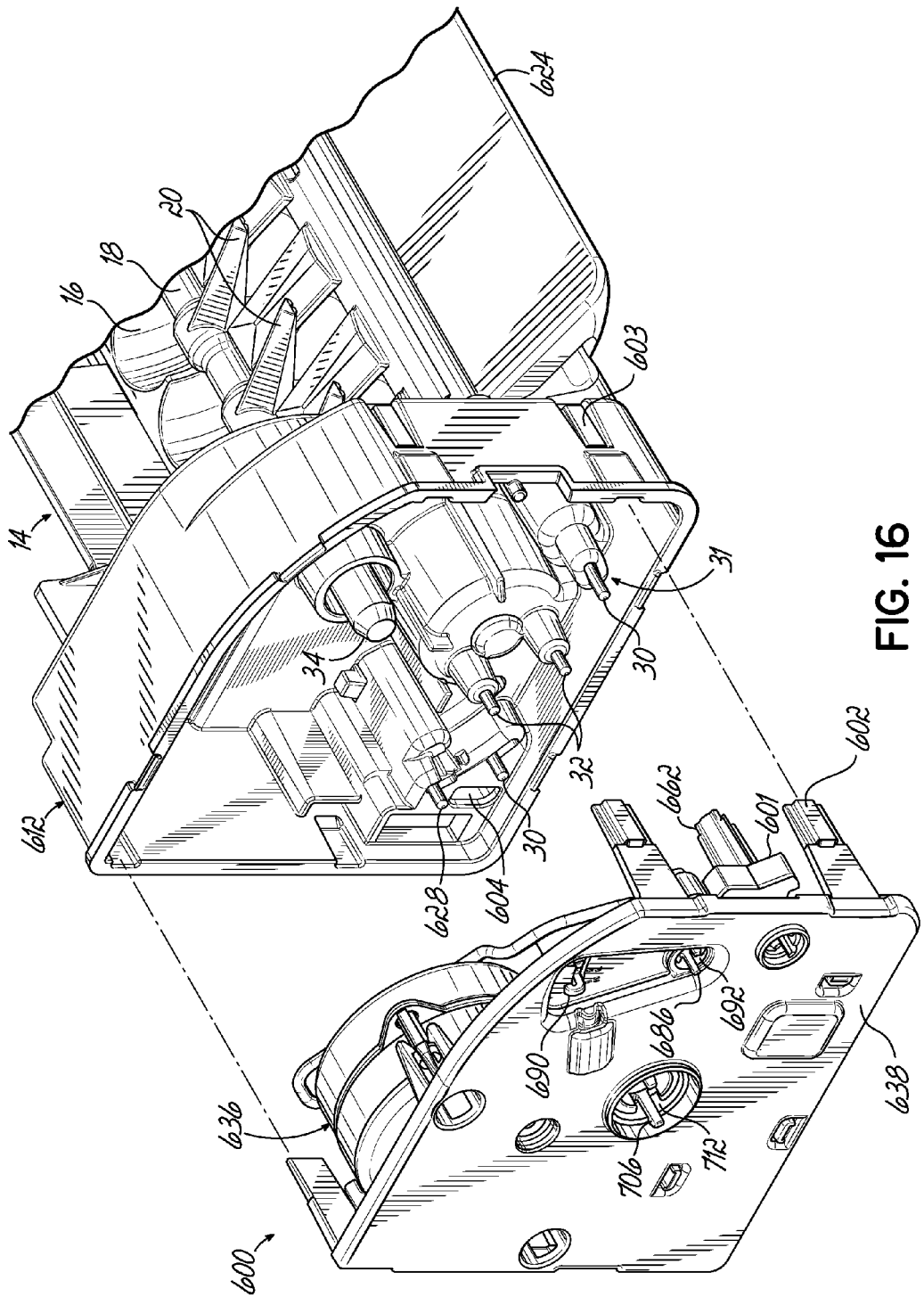
FIG. 16 is a perspective view of the icemaker control module of FIG. 15 separated from the icemaker.

A third embodiment 600 of an ICM is illustrated in FIGS. 15 and 16 attached to an icemaker. In the description that follows, like-numbers are used to refer to like-features of previous embodiments. A fascia 228 covers a base 638 within the control housing 612. A mechanical switch 601 is accessible for a person to operate and turn off the icemaker. A paddle 624 is at the rear of the control housing.

Figure 21A:
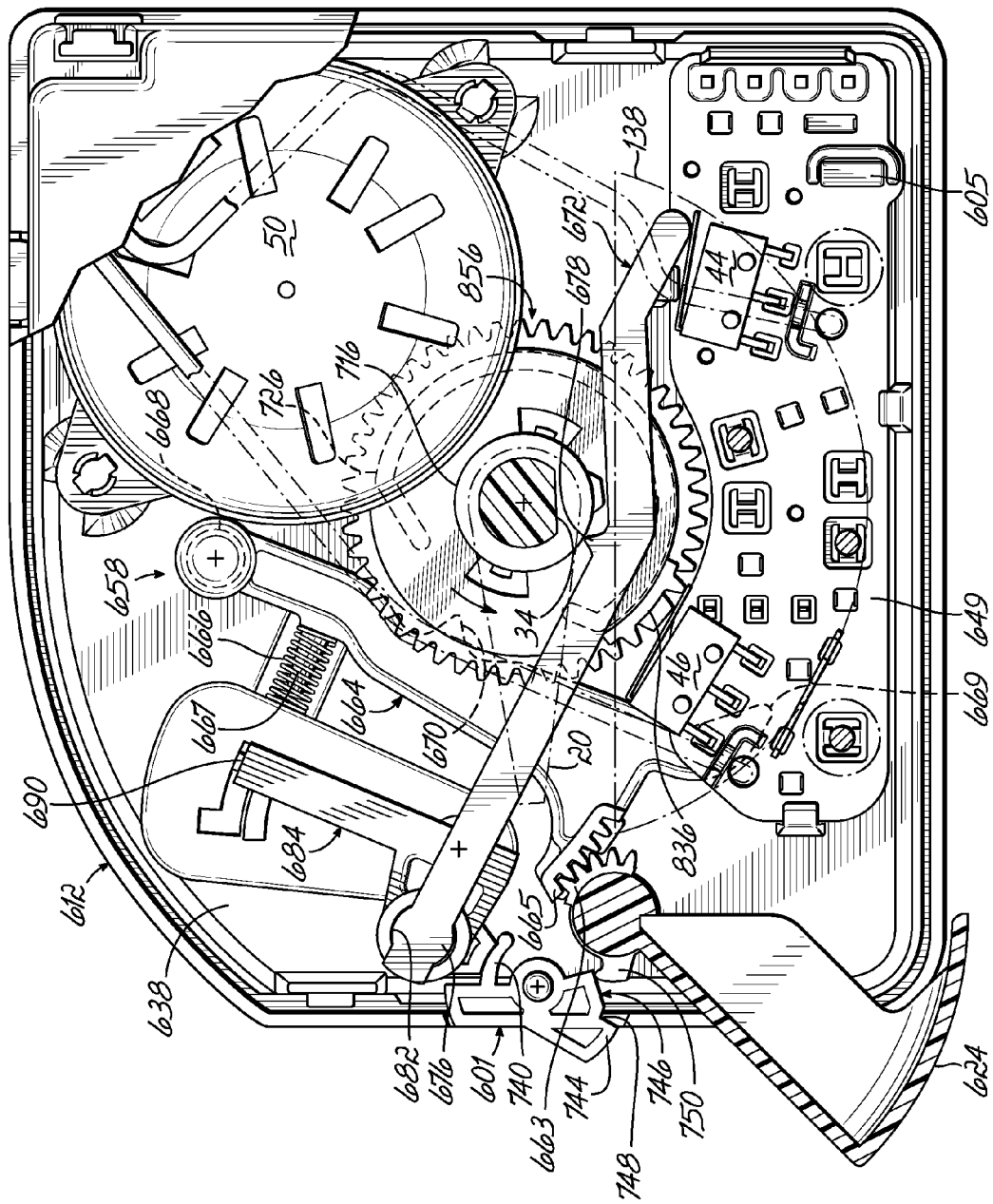
FIGS. 21A-21F are schematic partial cross sectional back views of the embodiment of the icemaker control module of FIG. 15, at various stages of an icemaker cycle.

In FIG. 16, the ICM is removed, showing a ground wire 628, two heater-contacts 30 from a heater 31, two thermostat contacts 32 from a thermostat 33, and the ejector shaft end 34. Feet 602 extend aft to snap into holes 603 on the housing. Also visible is an approximately D-shaped aperture 604 in the housing to receive a thermal cut out (TCO) device 605 that is a part of a circuit assembly 649 (FIG. 21A).

Figure 17:
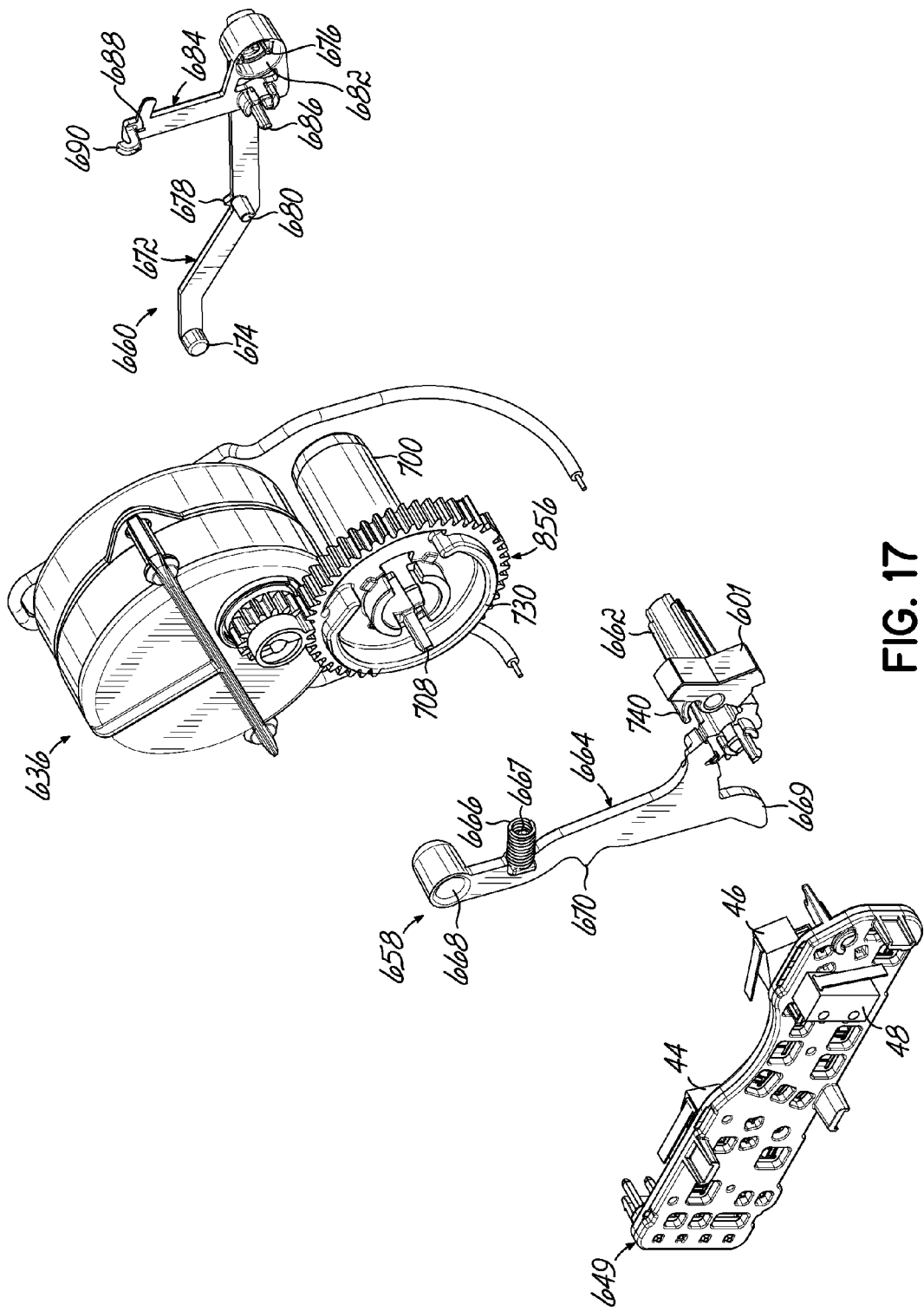
FIG. 17 is a partially exploded perspective view of the icemaker and the control module of FIG. 15.
Figure 18:
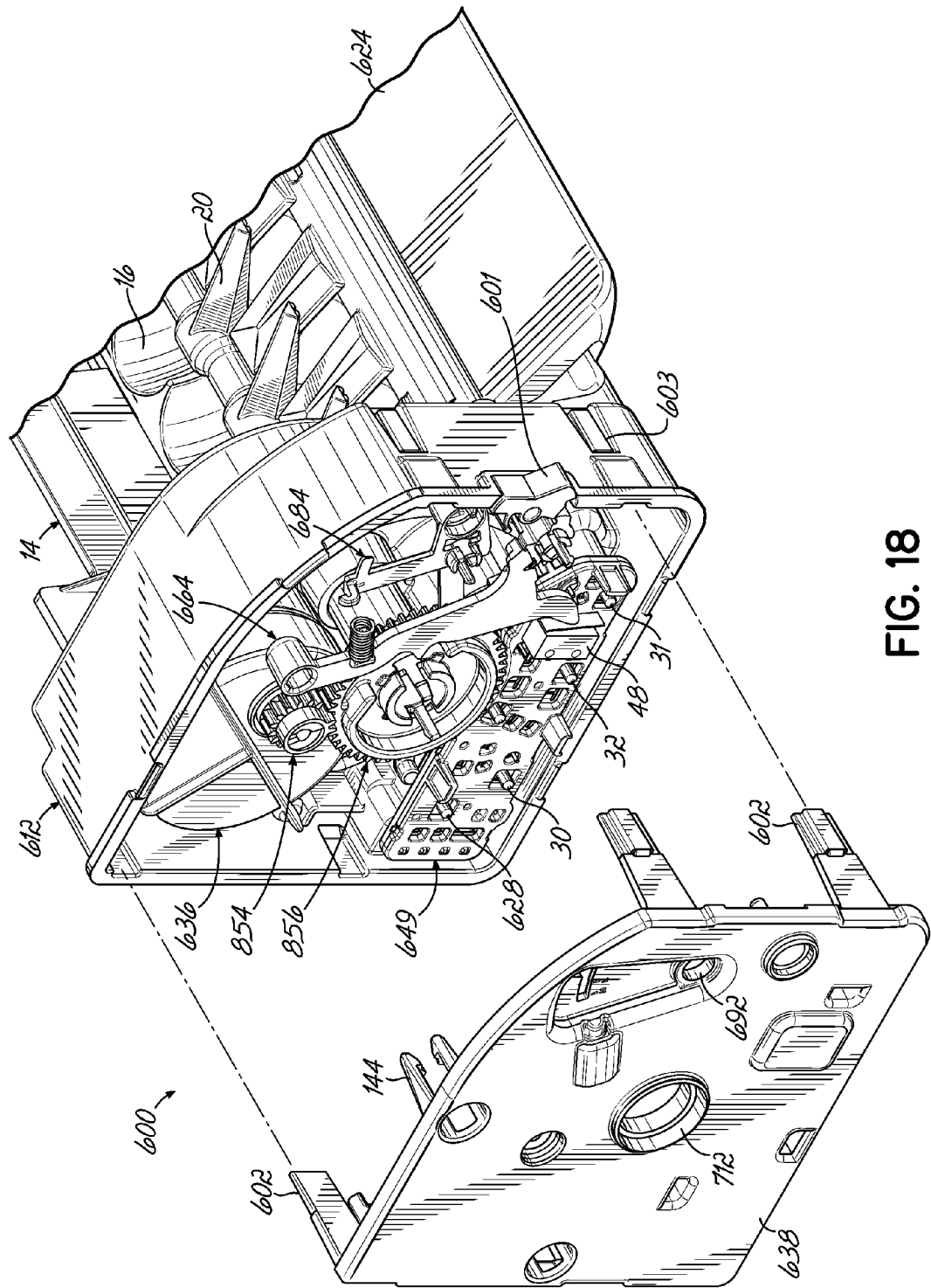
FIG. 18 is a perspective view of the icemaker and the control module of FIG. 15 with components of the control module moved into the icemaker so they are viewable from the front.

FIG. 17 illustrates subassemblies of ICM 600 while FIG. 18 shows those components assembled in the housing with the base 638 removed for illustrative purposes, even though the components cannot remain in position without support from the base 638. A circuit control assembly 649, drive assembly 636, and water-fill assembly 660 are packaged and sized differently than those of the earlier embodiments 10 and 500, but operate substantially the same. A drive gear 856 is substantially different, and will be described in greater detail later. A storage-sensing system 658 is different and configured to operate the paddle 624 in the lower right of the ICM rather than a bail arm 24 in the upper right of the earlier embodiments. The water-fill assembly 660 is moved and reconfigured on the base 638 at a position to make room for the storage-sensing system 658.

In greater detail, the storage sensing system 658 has a bail-pivot 662 snapped to the base 638 at its forward end and adapted to receive the paddle 624 at its aft end. As best seen at FIGS. 17 and 21A, the bail-pivot 662 has teeth 663 that couple the bail pivot to a bail rod 664 having teeth 665. An appendage or post 667 of the bail rod 664 rests in the inner diameter of one end of spring 666 while the other end of the spring bears against the base 638. The bail rod 664 also has an aperture 668 that snaps onto the base 638, a contact surface 669, and a cam follower 670, The water-fill assembly 660 has a fill lever 672 with a contact 674 at one end and a male coupling 676 at the other. In the approximate middle of the fill lever is a first cam follower 678 facing upward towards the center axis of the drive gear 856, and a second cam follower 680 facing forward. The male coupling of the fill lever snaps into an aperture 682 in a fill adjust lever 684. The fill adjust lever 684 has a second male coupling 686, at least one tooth 688, and a retainer 690. The second male coupling 686 snaps into the base 638 at an aperture 692 (FIG. 16).

With reference to FIGS. 19, 20A, and 20B, the drive gear 856 has a front face 694 with a front hub 696, and a rear face 698 with a rear hub 700. The front hub 696 has a radial bearing surface 702 and four axial bearing surfaces 704. Two resilient fingers 706 have a lead chamfer 708 and a seating surface 710. The fingers snap into the base 638 at an aperture 712 (FIG. 16) and retain the drive gear 856 while it rotates within the base 638. The rear hub 700 has a bore 713 and a flat 714 sized to assemble to the ejector shaft end 34 and the flat 36. Inside the bore is a partition 715 (FIG. 20A).

The drive gear, along with the circuit assembly 649 sequences and drives three functions. The three functions are the water-fill function, the storage-sensing function, and the start-stop function. Features of the drive-gear involved in each function will now be described. The functions themselves will be described later.

The water-fill function uses a water-fill-on profile 716 on an outside surface of the rear hub 700. The water-fill-on profile 716 has a protrusion 718 in the direction away from the center axis of the drive gear 856. A water-fill-off profile 720 having a protrusion 722 in the direction toward the center axis of the drive gear is on the rear face 698.

The storage sensing function is driven by a bail profile 726 on a radially outward surface 728 of an arcuate ridge 730 on the front face 694 of the drive gear.

The stop function of this embodiment, unlike earlier embodiments, does not use a notch in the gear teeth to allow the lever of home switch 46 to move into a notch, but instead uses an axially longer gear tooth 820 to depress the lever towards the body of switch 46. The lever of home switch 46 is more aft than the regular teeth 734 and is not touched by those teeth. It is touched only by teeth 820 and 821. Only one of the teeth, for example 820, is needed for stopping at the end of a harvest cycle. However another tooth 821 and a notch 814 and a tab 816 are also shown because these features are for the purpose of a delay drive 853 that will be explained with reference to later FIGS. 23A-24C. Having a delay drive 853 is not a requirement for an ICM that uses a paddle 624 as in embodiment 600 instead of a bail arm 24 as in embodiments 10 and 500. A drive gear that has two individual teeth rather than a tab 816, and only one extended tooth rather than two, would work. In other words a drive gear with profile 132, teeth 134, and extended tooth 820 may be used, but not with the delay drive 853 that will be later described.

Having described the various systems, functions, and piece parts, the assembly and function will now be described.

FIGS. 21A-21F illustrate the cycle of the icemaker control module as seen standing in the icemaker housing and looking at the control module. In FIG. 21A the icemaker control module is at its home state with the ejector 20 at approximately 200° and the cam follower 678 of the fill lever 672 resting on a cylindrical portion of the water-fill-on profile 716. The water fill switch 44 is in its up (off) position. The home switch 46 is in its down position depressed by extended tooth 820. The bail rod 664 is in its rest position and is not in contact with the bail rod cam profile 726. Shown in phantom lines is a half circular ice body 138. The protrusion 722 water fill off profile 720 is hidden from view behind the fill lever and the cam follower 680 is also hidden from view. The paddle 624 is in its up position indicating that the storage container is not so full that ice bodies blocked it from reaching the up position during the previous cycle. Spring 666 is keeping bail rod 664 towards the center of the drive gear, so that teeth 665 drive teeth 663 keeping the paddle 624 up.

Figure 21B:
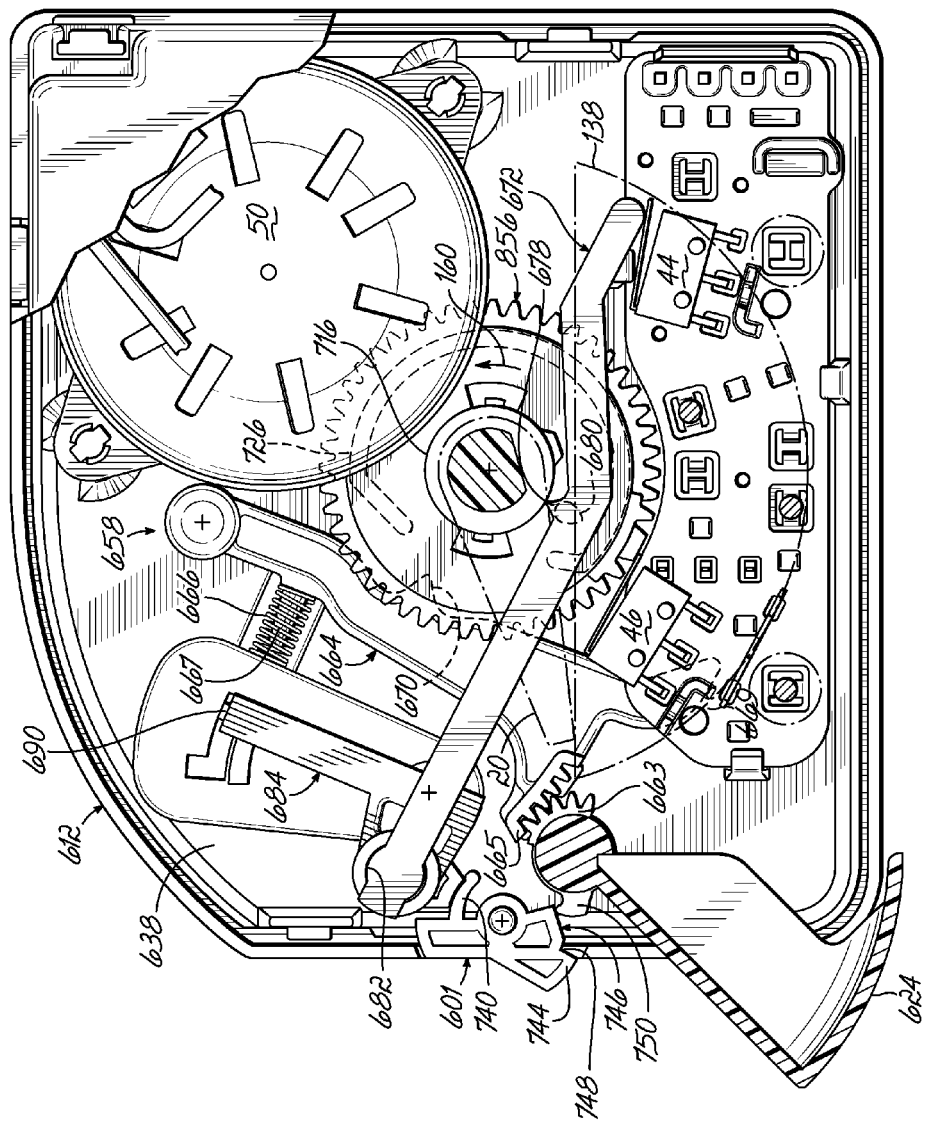

In FIG. 21B the cycle has begun in response to the thermostat 33 closing when it sensed the ice bodies in the mold were frozen and ready to be harvested. The thermostat allowed current flow to the heater 31 to warm the mold to loosen the ice bodies, and current to the motor assembly 50 to rotate the drive gear 856 counterclockwise as indicated by the arrow 160. During a period of time, the ejector 20 has traveled from the position shown in FIG. 21A, to the position of FIG. 21B where it is making contact with the top surface of the ice body 138. The home switch 46 is no longer depressed by extended tooth 820 to its down position, and if tooth 821 is present, and holding it down, it has no effect.

Figure 21C:
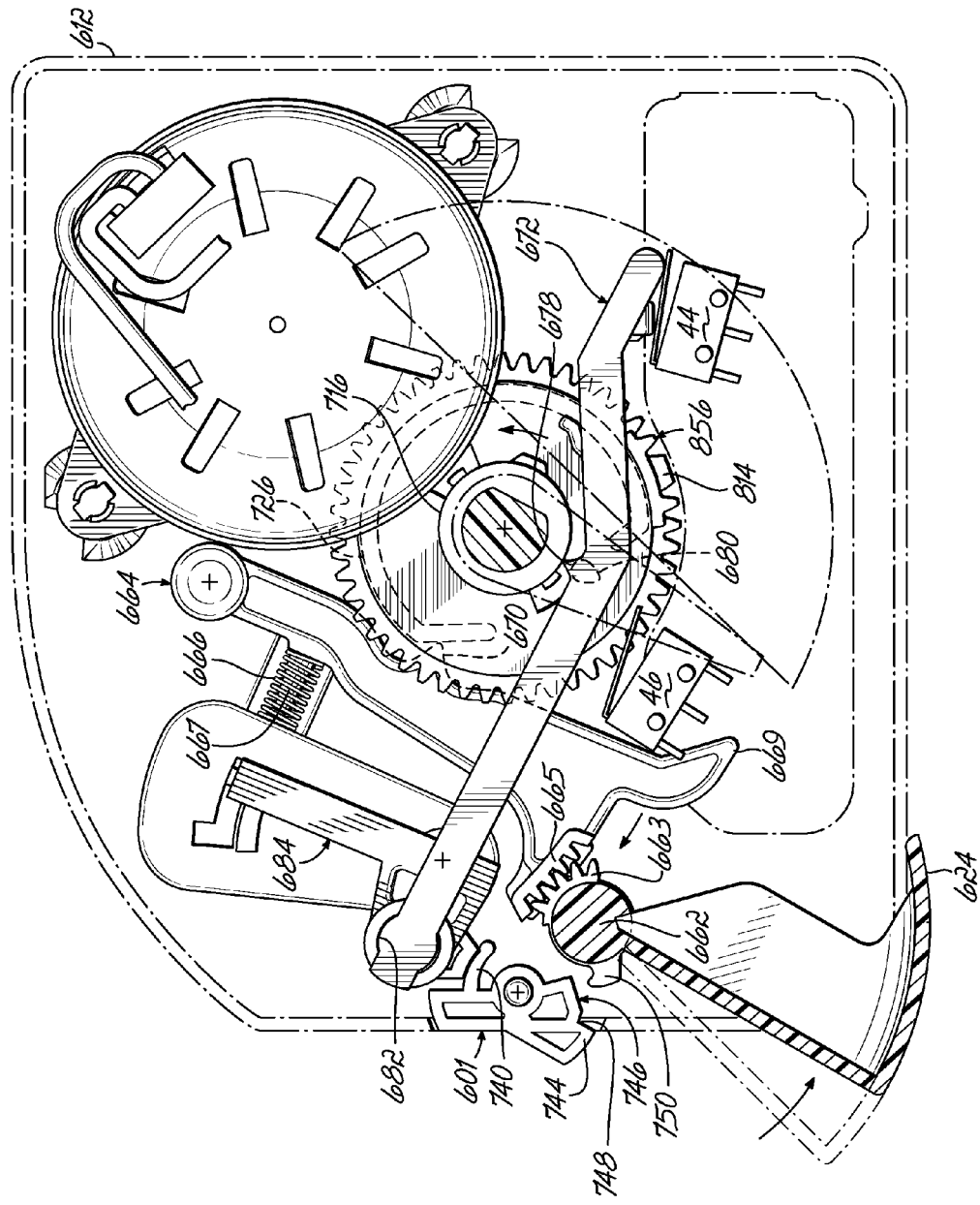

FIG. 21C continues the cycle with the ejector having scooped the ice body 138 partly out of the ice mold. Bail profile 726 has rotated and made contact with cam follower 670, and has started to push up on the bail rod 664. The bail rod rotates the bail pivot 662 compressing spring 666 and lowering paddle 624 so that it will be out of the way when ice bodies are released to fall into the storage container. The home switch 46 is no longer in its down position depressed by extended tooth 820 but is instead in its up position.

Figure 21D:
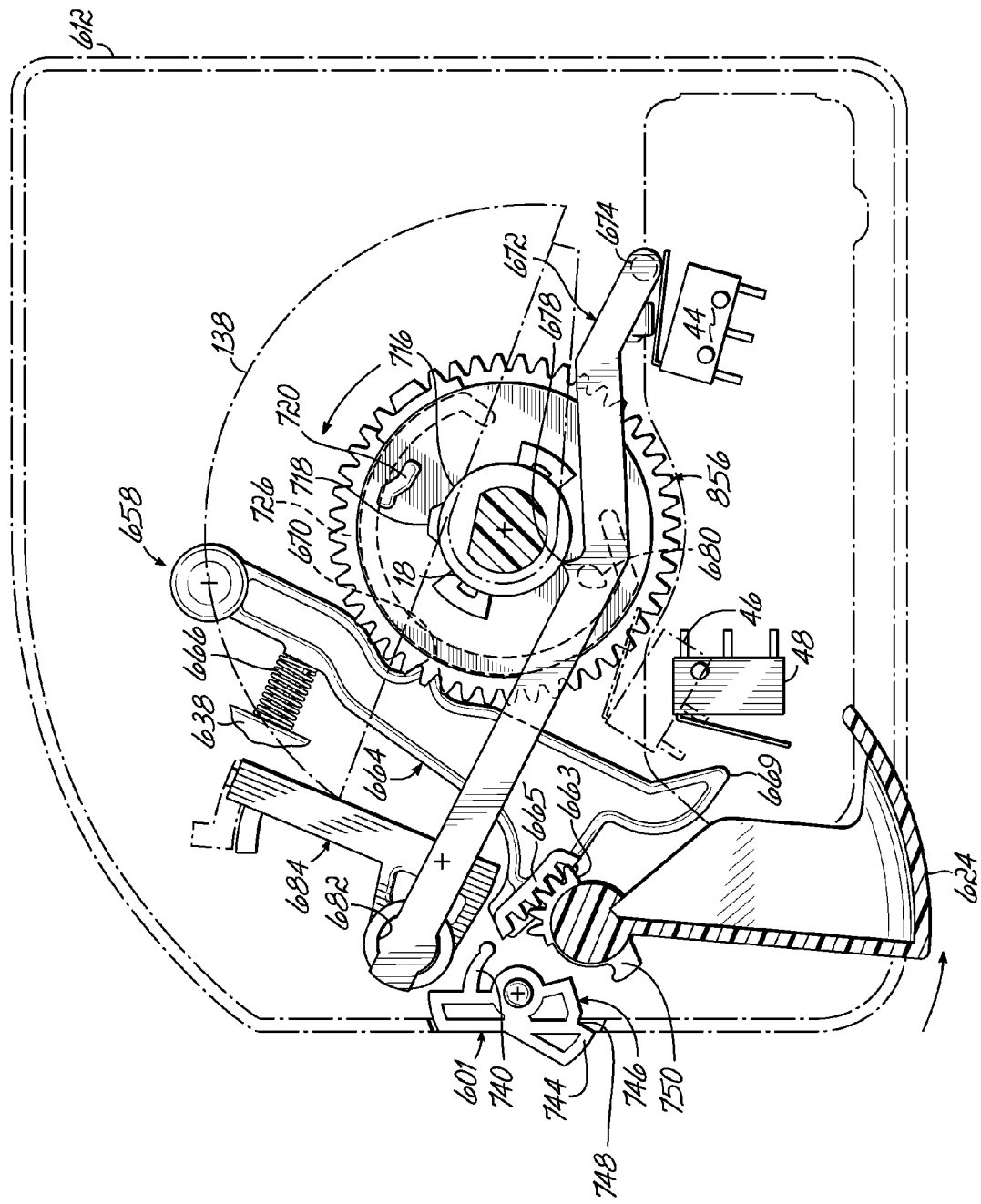

In FIG. 21D, continued rotation has brought the paddle 624 lower, as the cam follower 670 is pushed by the bail profile 726. The ice body (actually all the ice bodies on a series of ejectors along the shaft) has been brought onto what is now an upward facing surface 162 of the ice ejector. Gravity causes the ice body to slide off the ejector and past the lowered paddle 624. If the storage container has room, the ice bodies will fall into the storage container and away from the paddle.

Through the previous figures, cam follower 678 of the fill lever 672 has been near to, or in contact with, profile 716 on the drive gear. This profile is generally round, but it may also be made sloping, especially as it nears protrusion 718.

Figure 21E:
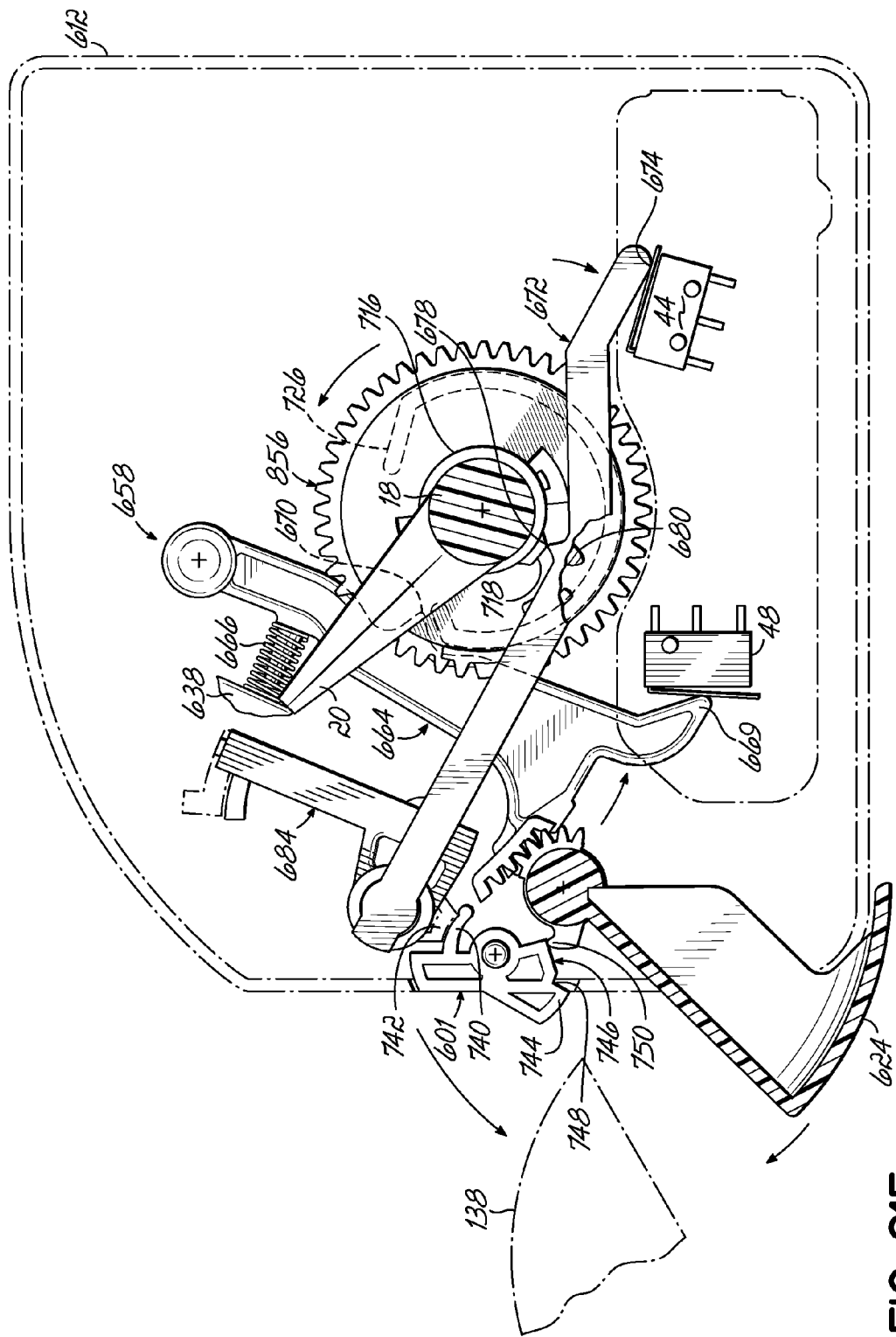

In FIG. 21E profile 718 has caused the fill lever 672 to push down with contact 674 against fill switch 44, overpowering the internal spring force of the fill switch 44. Fill switch 44 sends electric current to the water supply valve 15 (FIG. 13A-C) in the supply line to the icemaker, so that the valve will allow water to flow. Water will flow for as long as the fill switch 44 is depressed. It is contemplated that if needed, other timing interlocks could be put in the circuit to prevent water flowing an unreasonable length of time, and thus flooding the icemaker. The ice body falls to the storage container, and since no ice bodies are in the way of paddle 624, spring 666 raises the paddle 624 and bail rod 664 causing contact 669 to actuate the ice body storage level switch 48 to set the circuit to harvest again, next cycle.

Figure 21F:
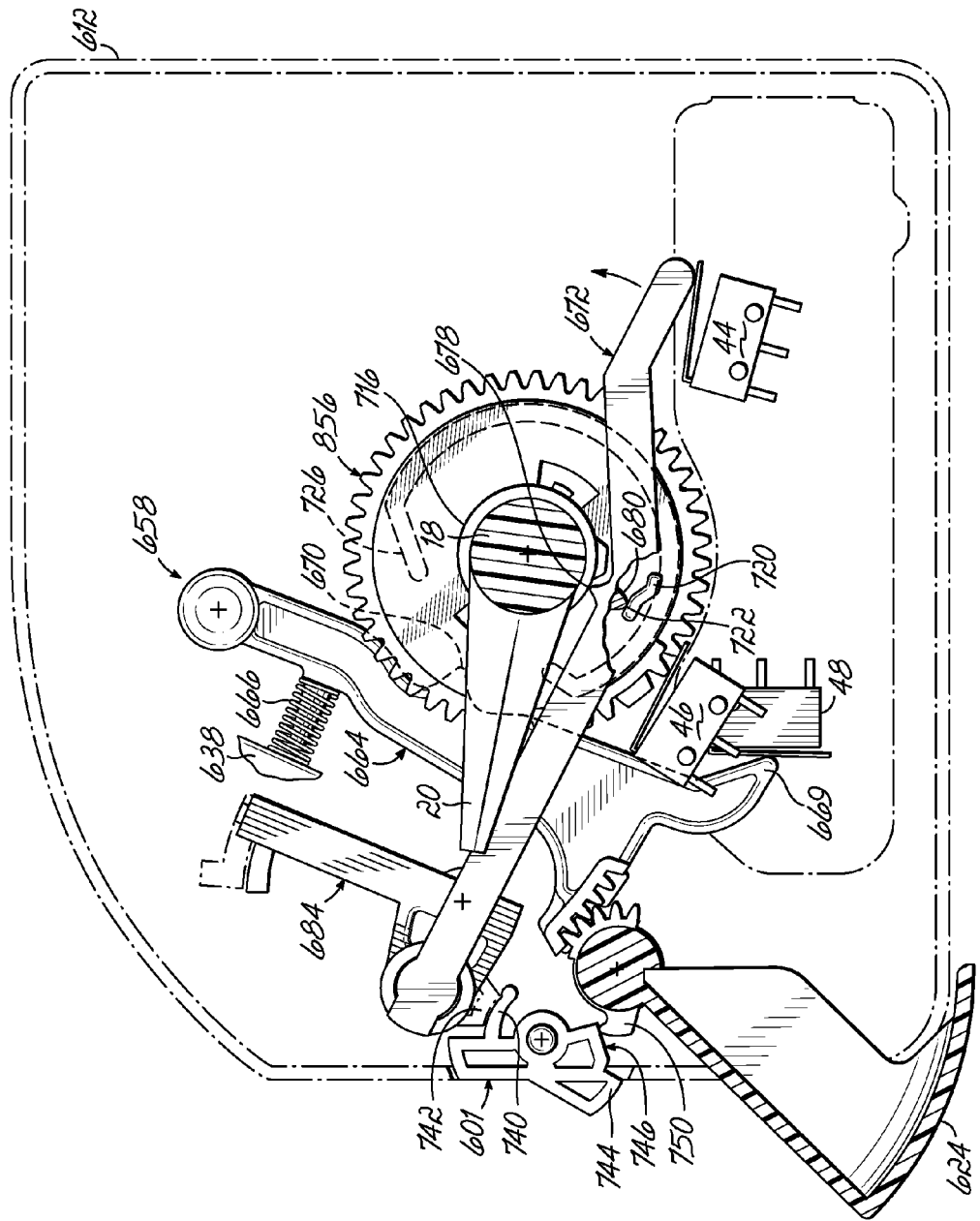

In FIG. 21F, protrusion 618 has moved past cam follower 678, and the internal spring of fill switch 44 has re-opened the switch, stopping the water flow, and raising the fill lever 672. Protrusion 722 pushes the fill lever 672 up at follower 680. This protrusion 722 is an assist or a backup for the internal spring force of fill switch 44 to return the fill lever to the up position. The switch may have enough spring force to move the lever itself, or protrusion 722 may perform the lifting. The switch pushes the fill lever, but the fill lever does not pull the switch.

After FIG. 21F, the cycle completes by returning to the position shown in FIG. 21A. The motor stops when home switch 46 returns to its down position depressed by extended tooth 820. The icemaker will remain stationary until the start of the next cycle that will begin if two conditions are met: First, the paddle 624 is in the up position, and second, the thermostat senses that the ice bodies are ready to be harvested.

FIG. 21F also illustrates on/off rocker switch 601 in the "ON" position. Switch 601 does not substantially contact bail pivot 662, and bail lever 664 has ice body storage level switch 48 depressed. Also, a tab 740 of the rocker switch 601 is in contact with a detail 742 molded in the control module base 638 which frictionally prevents the rocker switch 601 from moving until a person presses (arrow 745 FIG. 22) on a lower section 744 of the rocker switch 601. Note that in FIG. 22 the insert molded circuit board is omitted for clarity, but an ice body storage level switch 48 normally attached to the forward side of the circuit board is shown.

Figure 22:
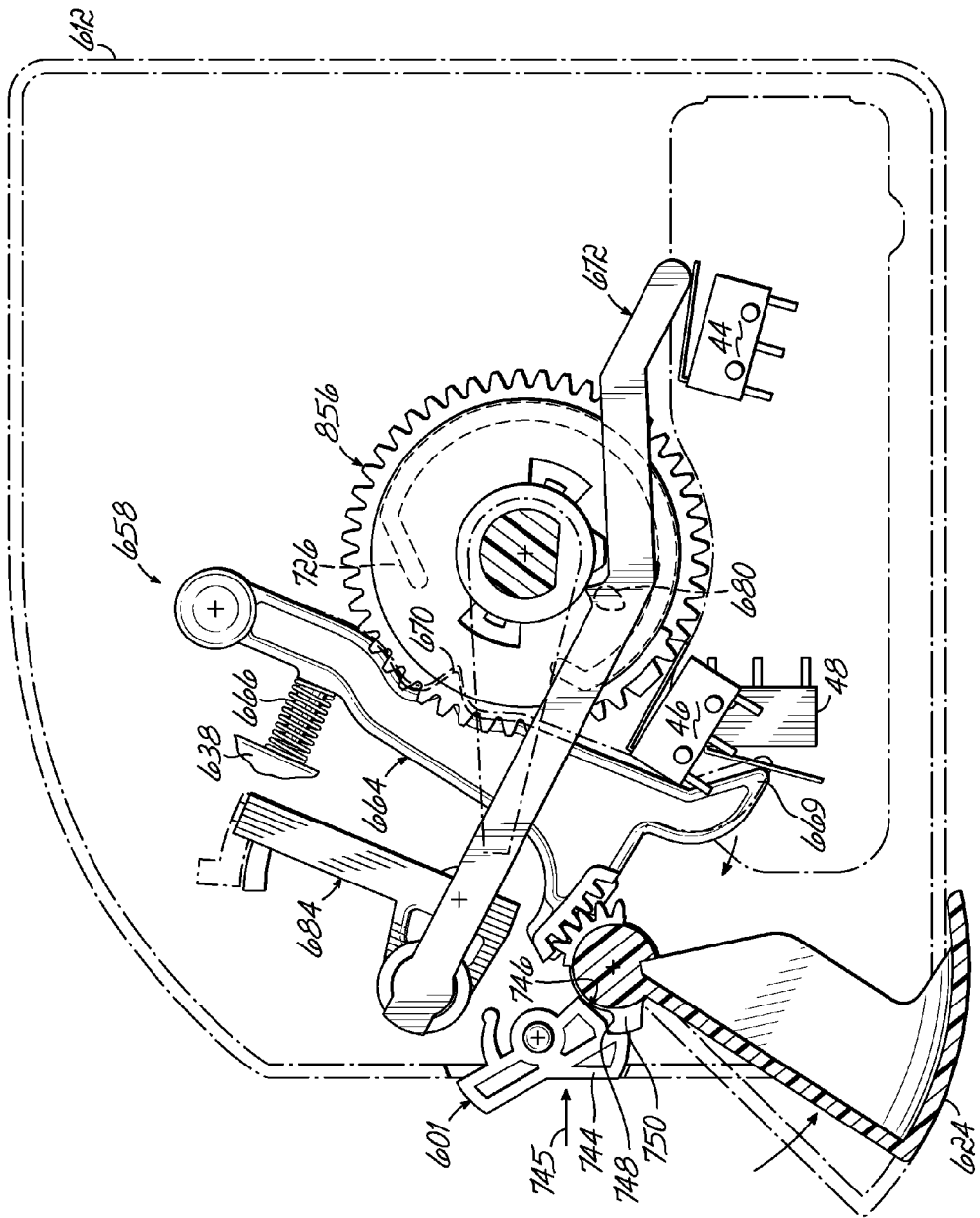
FIG. 22 is a schematic partial cross sectional back view of the embodiment of the icemaker control module of FIG. 15 to show the function of the mechanical off switch.

FIG. 22 illustrates the on/off rocker switch 601 in the "OFF" position. A detail 746 on the bottom of the switch acts as a ramp to rotate the bail pivot 662, which rotates the bail lever 664 so the ice body storage level switch 48 is no longer depressed. There is also a small recessed area 748 at the end of the detail 746 that acts as a socket for a bump 750 on the bail pivot, holding the rocker switch 601 in the "OFF" position.

A delay drive 853 will now be described with reference to FIGS. 23A-H and 24A-C. The delay drive may be incorporated in any of the previous embodiments, and has been shown but not fully described in embodiment 600.

The delay drive system 853 offers an advantage of being able to turn the heater off as soon as the ice has been released from the mold and providing power to the fill valve directly rather than through the heater element. This has not been possible in previous designs because the heater must remain on until the thermostat is reset to the off position. If the thermostat is not reset by the time the gear has completed one revolution, the circuit will still be made to start another harvest cycle. Some current designs use a higher temperature reset point and a two revolution cycle to guarantee the thermostat will reset prior to the water fill. If the thermostat does not reset prior to the water fill, there is a concern that it will also not be reset by the end of the cycle, resulting in a second cycle. To prevent a second fill in the event of a second cycle, the electrical circuit for the water valve is run through the heater element, as shown in FIGS. 13A-13C. If the heater is still energized when the fill circuit is made, the electric current will take the path of least resistance (direct from the heater element to neutral rather than through the water valve) and the valve will not be turned on. This circuit arrangement results in reduced voltage at the valve because of the resistance of the heater element. This reduced voltage sometimes results in inconsistent valve operation. Previous designs have had to balance the requirement for the drive gear to rotate fast enough to provide a short, accurate fill time but slow enough to allow the thermostat to reset within one revolution. The delay drive system 853 allows the heater to be turned off as soon as the ice is released from the mold, the drive gear to rotate fast enough to provide a short, accurate fill time, then a delay period allowing the warm (room temperature) water used to fill the mold to warm the thermostat above its reset point. The delay drive 853 provides 1. reduced energy consumption because the heater is turned off as soon as the ice is released from the mold. This reduces the energy actually used by the icemaker during the harvesting process as well as reducing the energy required by the freezer to remove the additional heat put into the freezer compartment when the heater was left on to warm up the thermostat. 2. Full line voltage applied to the water valve 15, eliminating some service calls due to low voltage conditions.

FIGS. 23A through 23H illustrate the actions of the delay drive 853 comprising a motor pinion gear 854 and a drive gear 856.

Figure 23A:
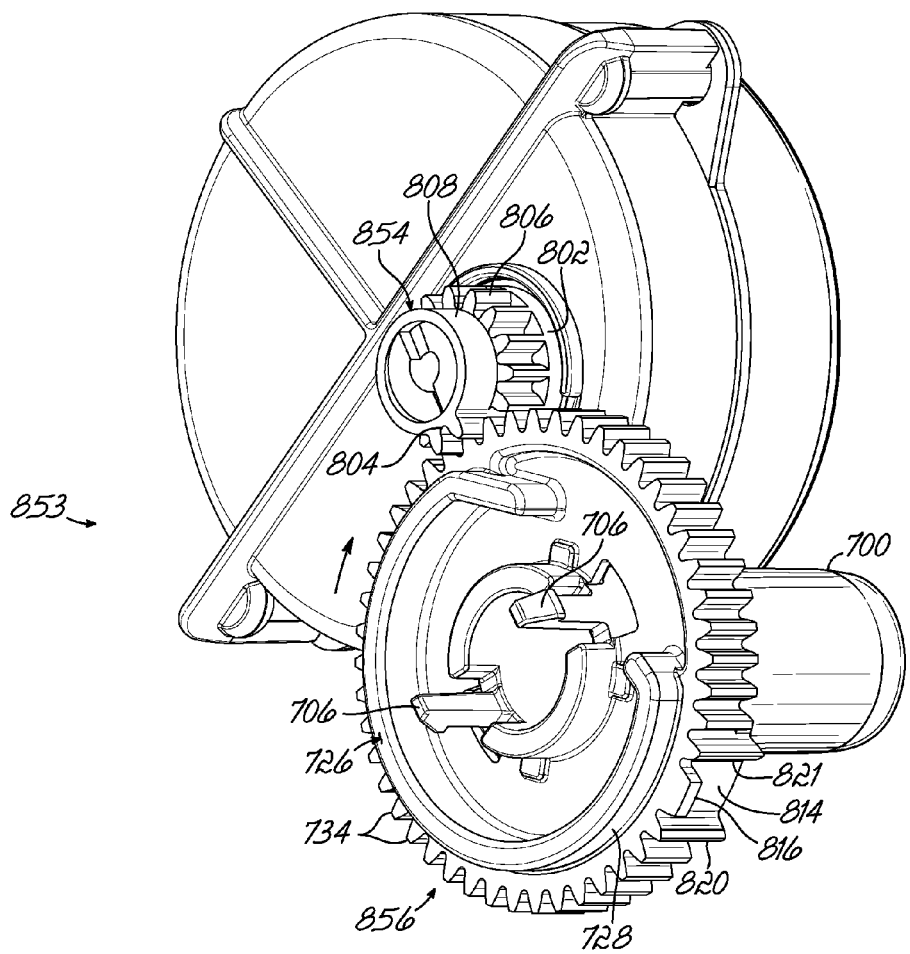
FIG. 23A is a perspective view of the drive gear and motor with pinion of FIG. 17.
Figure 23B:
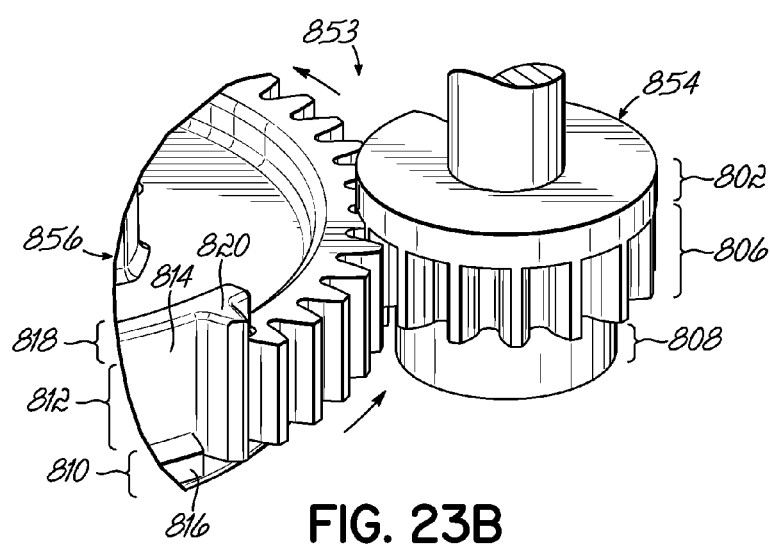
FIGS. 23B thru 23H are sequential perspective views of the drive gear and pinion gear of FIG. 23A.
Figure 23C:
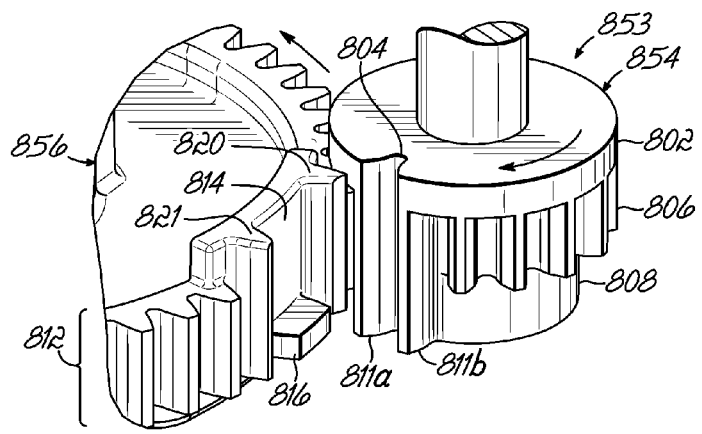

The motor pinion 854 is divided into three levels. An aft level 802 is solid and flush with the OD of the teeth except for a cut out 804 for one tooth profile. The mid level 806 is a standard gear profile all the way around. The forward level 808 is solid and flush with the root diameter of the teeth except for two teeth 811*a*, 811*b* aligned with the tooth cut out on the aft level 802. Most of the time, the pinion 854 drives the gear 856 through normal gear mesh at the center level 806 as seen in FIGS. 23B and 23C.

The main gear 856 also is divided into three levels. A forward level 810 has two teeth connected together to form tab 816. A mid level 812 is a standard gear profile except at a delay position 814 where two teeth are removed. An aft level 818 has the extended teeth 820 and 821.

Figure 23D:
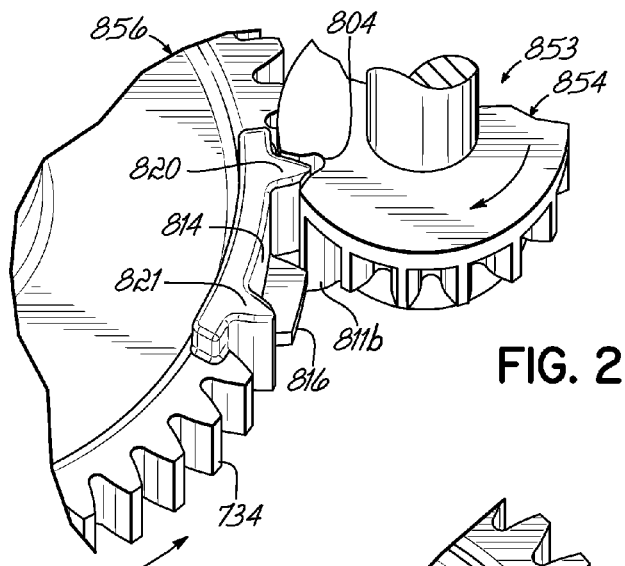

In FIG. 23D, as the pinion 854 drives the gear 856 into the delay position 814, the cut out 804 in the top level of the pinion meshes with the extended tooth 820 on the top level of the gear.

Figure 23E:
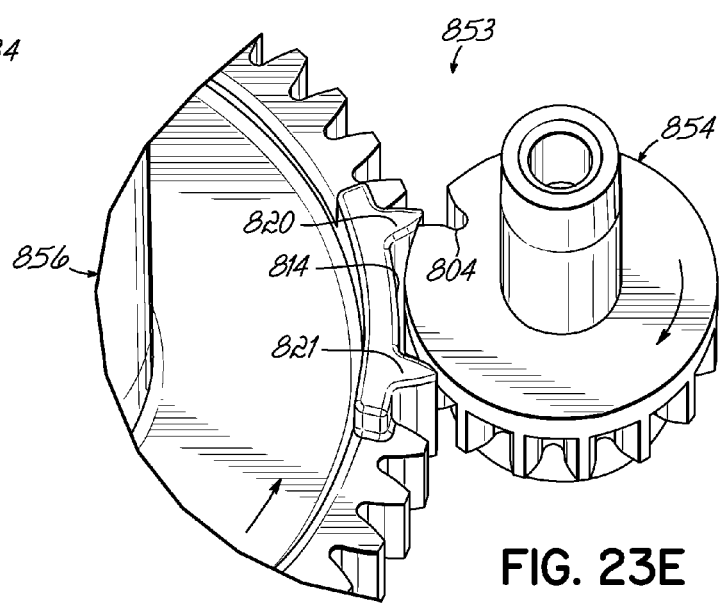

In FIG. 23E, as the pinion continues to drive the gear into the delay position where there are no teeth in the center section of the gear, the gear 856 will stop rotating even though pinion gear 854 continues to rotate.

Figure 23F:
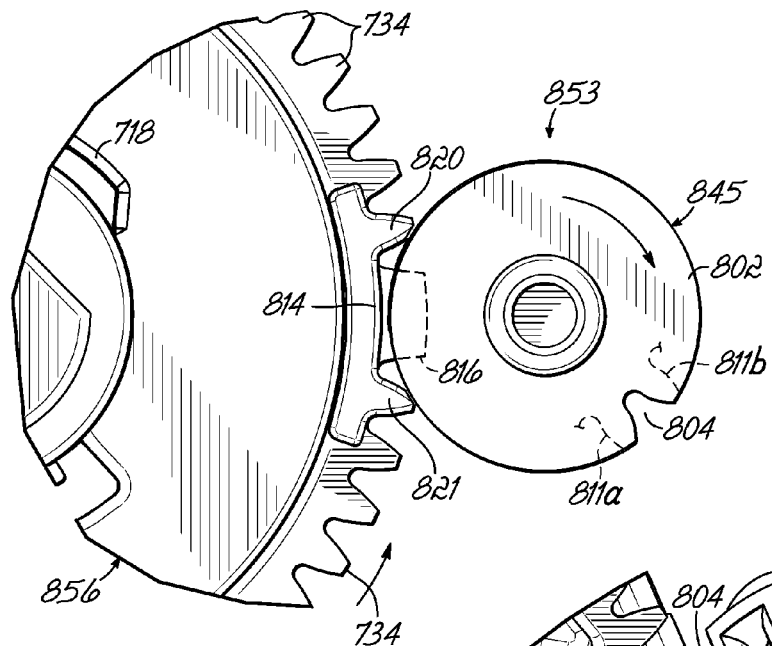

In FIG. 23F the solid diameter at the top of the pinion 854 will interfere with the two extended teeth 820 and 821 at the top of the gear 856, preventing the gear from rotating from external forces.

Figure 23G:
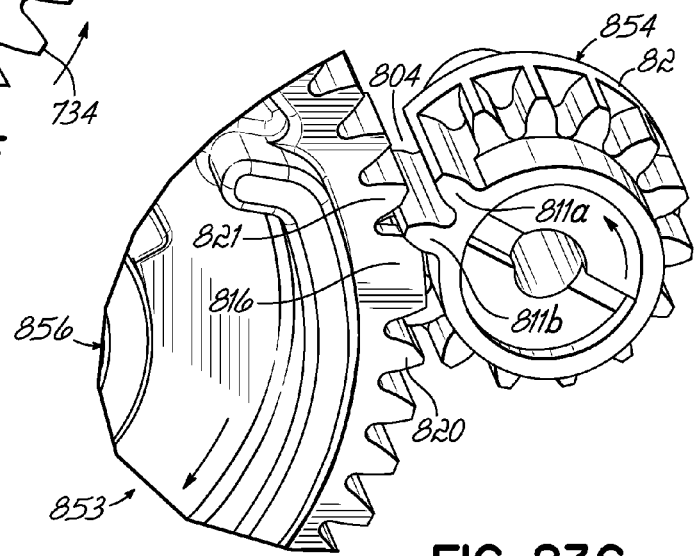

In FIG. 23G as the pinion completes its rotation, the extended teeth 811*a*, 811*b* on the bottom of the pinion engage with the tab 816 on the bottom level of the gear, causing the gear 856 to begin rotating again.

Figure 23H:
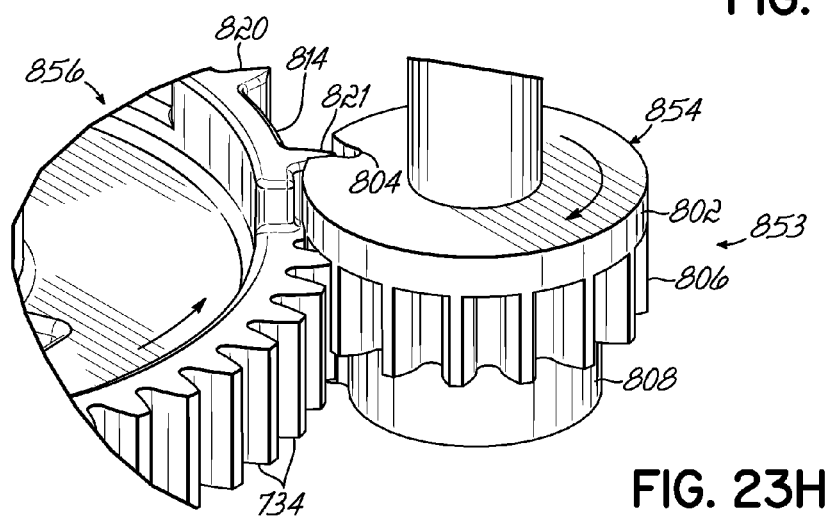

In FIG. 23H as the pinion and gear rotate together, the teeth are again meshed and the pinion continues to drive the gear normally until the delay position 814 comes around again.

Figure 24A:
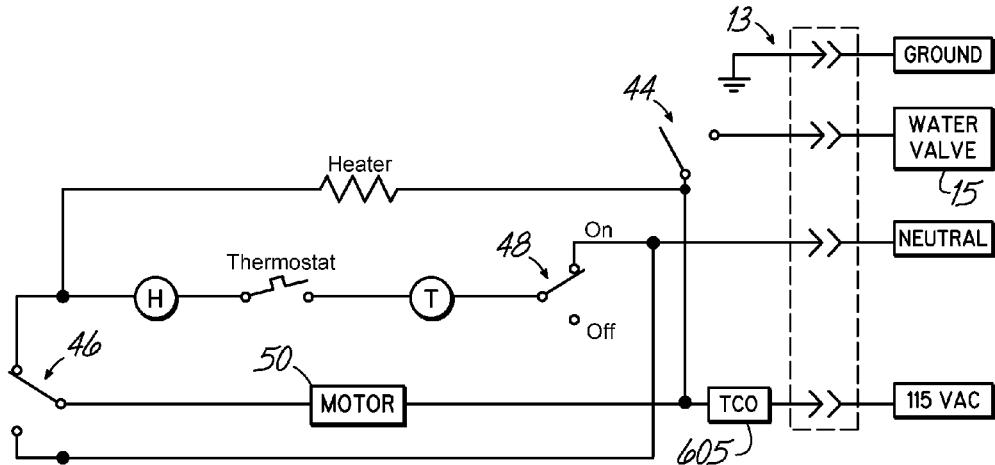
FIG. 24A through 24C are electrical diagrams of portions of the operating cycle of an icemaker control module of any of the previous embodiments with the delay drive of FIG. 23A through 23H.
Figure 24B:
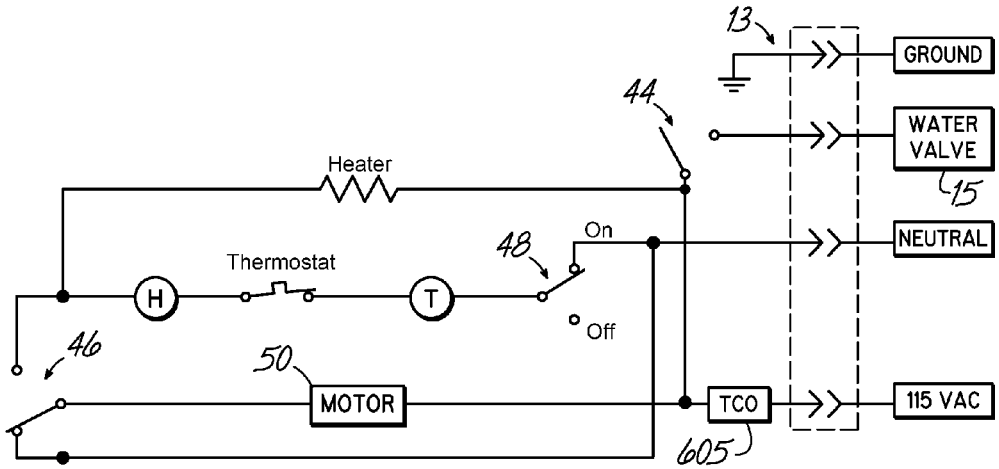
Figure 24C:
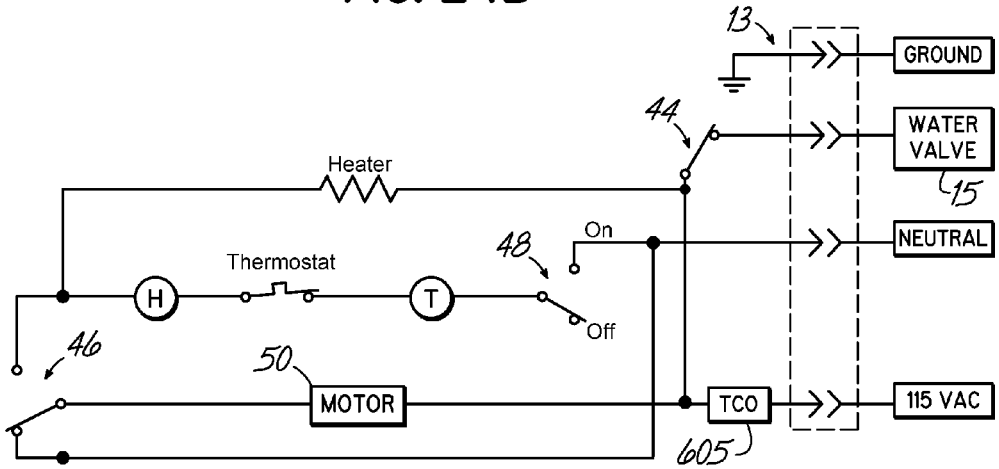

FIGS. 24A through 24C are electrical diagrams depicting the operating cycle of the icemaker control modules of the previous embodiments with the delay drive 853.

In FIG. 24A the ice bodies are not yet ready for harvest, so the thermostat is above its trigger temperature and is open while the home switch 46 is at an upwards position in the figure. In FIG. 24B, the thermostat has closed and the motor has started to rotate moving extended teeth 820 and 821 away from home switch 46 and allowing it to move to the downward position in the figure. With continued rotation, ice body storage profile 126, 726 pushes the bail rod 64, 664 opening ice body storage level switch 48 between the thermostat and neutral, stopping electric flow through the heater even though the thermostat may remain closed. Electricity continues to flow to the motor assembly 50, and pinion gear 854 continues to rotate drive gear 856 long enough for the water fill switch 44 to be opened and then closed by profile 116, 716 and protrusion 118, 718. This action fills the ice body tray 14 with room temperature water. Then the delay position 814 on drive gear 856 meets the pinion gear 854 and the drive gear 856 stalls (stops rotating) while the pinion gear 854 continues to rotate. This period of stall is approximately 50 seconds, by way of example, and is ample time for the room temperature water to warm the ice body tray 14 and the thermostat to reset (open). During this stall the ice body storage level switch 48 continues to be held in the open position by the action of ice body storage profile 126, 726. When tooth 811*a* restarts rotation of drive gear 856, the bail rod comes off of ice body storage profile 126, 726 allowing the ice body storage level switch 48 to close again (if there are not excess ice bodies blocking it). The cycle stops when extended tooth 820 reaches home switch 46 and the switch opens, returning the electrical system to the state illustrated in FIG. 24A.

The electrical schematics of FIGS. 24A-C also differ from those of FIGS. 13A-C in that the TCO 605 is included. Also, test-points V, Mt, N, and L are not shown, and are not needed except per customer request.

There are at least two additional features contemplated to enhance the fail-safe operation while still having the energy saving benefits of the delay drive. The first is to use the electronic control of the refrigerator to monitor the water valve operation and not allow the water valve to operate for more than 10 seconds within a 30 minute time period. This time is for example only, with actual times being dependent on the ice body size, and other factors for a specific icemaker. Actual times may be determined by testing. This option could be further enhanced by adding a warning light or buzzer to the refrigerator control panel indicating that the icemaker thermostat has failed if the icemaker calls for another fill too quickly.

The second is to turn the heater off as soon as the ice has been released from the mold but keep the water fill at the end of the cycle. Pausing the drive gear 856 gives time for the residual heat from when the heater was on to reset the thermostat, then resume rotation of the drive gear, close the ice body storage level switch 48, and activate the fill switch 44. If the thermostat did not reset, the current will flow through the heater instead of the water valve as described in earlier explanations and the icemaker will continue through another harvest cycle where the heater will be on to warm the mold body more, this time without ice bodies in the mold, so the thermostat will reset. The thermostat trip points will be designed so that normal operation will result in a single cycle, saving energy, but if unusual circumstances or a thermostat failure cause the thermostat not to reset before the fill switch is activated, the old "through the heater" fail safe circuit path will prevent water overfilling.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. A method for reducing the energy consumption of an icemaker comprising, in order:
   beginning harvest when a thermostat closes a circuit to send electric current through a heater and to a motor rotating a gear, said heater heating an ice mold to loosen ice bodies;
   said gear stopping current flowing through the heater after the ice releases from the mold;
   said gear continuing to rotate to open and close a water valve to fill the mold with water;
   said gear pausing rotation in a position that continues to prevent current flowing through the heater;
   said gear resuming rotation to complete the harvest cycle at an elapsed time calculated to allow the thermostat to reset from the warmth of the water that filled the ice mold.

2. The method of claim 1 wherein the current flow through the heater is interrupted by the drive gear's action on an ice body storage level switch.

* * * * *